United States Patent
Choi et al.

(10) Patent No.: US 12,264,747 B2
(45) Date of Patent: Apr. 1, 2025

(54) LOADLOCK APPARATUS AND SUBSTRATE PROCESSING APPARATUS INCLUDING THE SAME

(71) Applicant: SAMSUNG ELECTRONICS CO., LTD., Suwon-si (KR)

(72) Inventors: Jinhyuk Choi, Suwon-si (KR); Kongwoo Lee, Seoul (KR); Beomsoo Hwang, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 484 days.

(21) Appl. No.: 17/724,214

(22) Filed: Apr. 19, 2022

(65) Prior Publication Data

US 2023/0097418 A1 Mar. 30, 2023

(30) Foreign Application Priority Data

Sep. 28, 2021 (KR) .................. 10-2021-0128349

(51) Int. Cl.
*F16K 3/02* (2006.01)
*F16K 27/00* (2006.01)
*F16K 51/02* (2006.01)
*H01L 21/67* (2006.01)

(52) U.S. Cl.
CPC ............ *F16K 27/003* (2013.01); *F16K 3/029* (2013.01); *F16K 51/02* (2013.01); *H01L 21/67201* (2013.01)

(58) Field of Classification Search
CPC .............................. F16K 30/29; F16K 3/0218
See application file for complete search history.

(56) References Cited

U.S. PATENT DOCUMENTS

| | | | |
|---|---|---|---|
| 7,422,653 B2 | 9/2008 | Blahnik et al. | |
| 7,622,008 B2 * | 11/2009 | Hiroki | F16K 3/029 |
| | | | 156/345.31 |
| 8,272,825 B2 * | 9/2012 | Hofmeister | H01L 21/67201 |
| | | | 414/217 |
| 10,566,205 B2 * | 2/2020 | Salinas | H01L 21/67201 |
| 10,854,478 B2 * | 12/2020 | Hofmeister | H01L 21/67017 |
| 10,971,382 B2 | 4/2021 | Kim et al. | |
| 2006/0196422 A1 * | 9/2006 | Hiroki | F16K 51/02 |
| | | | 156/345.31 |
| 2009/0320948 A1 * | 12/2009 | Asanuma | F16K 3/0218 |
| | | | 137/627.5 |
| 2010/0054905 A1 * | 3/2010 | Behdjat | H01L 21/67236 |
| | | | 414/217 |
| 2015/0101754 A1 | 4/2015 | Yang | |
| 2019/0048470 A1 | 2/2019 | Khan et al. | |

* cited by examiner

*Primary Examiner* — Mark C Hageman
(74) *Attorney, Agent, or Firm* — Myers Bigel, P.A.

(57) ABSTRACT

A loadlock apparatus includes a loadlock chamber including a first opening and a second opening separated in a vertical direction; a first slit valve including a first valve plate configured to move between a first open position where the first opening is open and a first closed position where the first opening is closed, the first open position being a position moved downward from the first closed position; and a second slit valve including a second valve plate configured to move between a second open position where the second opening is open and a second closed position where the second opening is closed, the second open position being a position moved upward from the second closed position.

20 Claims, 22 Drawing Sheets

LOADLOCK APPARATUS AND SUBSTRATE PROCESSING APPARATUS INCLUDING THE SAME

CROSS-REFERENCE TO RELATED APPLICATION

This application is based on and claims priority under 35 U.S.C. § 119 to Korean Patent Application No. 10-2021-0128349, filed on Sep. 28, 2021, in the Korean Intellectual Property Office, the disclosure of which is incorporated by reference herein in its entirety.

BACKGROUND

The inventive concept relates to a loadlock apparatus and a substrate processing apparatus including the same.

In general, a substrate processing apparatus includes: a load port which is called a front open unified pod, and on which a carrier is seated; an equipment front end module which maintains high cleanliness; a loadlock apparatus which accommodates a substrate therein, and of which internal pressure is adjusted between atmospheric pressure and vacuum pressure; a transport module configured to transport the substrate; and a processing module configured to perform a semiconductor process on the substrate. There is increased demand for a substrate processing apparatus having high productivity and a small footprint.

SUMMARY

The inventive concept provides a loadlock apparatus and a substrate processing apparatus including the same.

According to the inventive concept, a loadlock apparatus includes: a loadlock chamber including a first accommodation space, and a second accommodation space above the first accommodation space, the first accommodation space having a first opening, and the second accommodation space having a second opening; a first slit valve including a first valve plate configured to open and close the first opening, and a first actuator configured to move the first valve plate between a first open position where the first opening is open and a first closed position where the first opening is closed, wherein the first valve plate is configured to move to the first open position in a first vertical direction; and a second slit valve including a second valve plate configured to open and close the second opening, and a second actuator configured to move the second valve plate between a second open position where the second opening is open and a second closed position where the second opening is closed, wherein the second valve plate is configured to move to the second open position in a second vertical direction opposite to the first vertical direction, wherein the first valve plate and the second valve plate vertically overlap, and wherein each of the first valve plate and the second valve plate has a vertical height and a horizontal width, wherein the vertical height is less than the horizontal width.

According to the inventive concept, a substrate processing apparatus includes: a first chamber; a plurality of first load ports at a side part of the first chamber; a first loadlock apparatus at the side part of the first chamber; a first substrate transport robot configured to move inside the first chamber and transport a first substrate between a first substrate carrier and the first loadlock apparatus; a substrate transport chamber connected to the first loadlock apparatus; a processing chamber connected to the substrate transport chamber; and a second substrate transport robot in the substrate transport chamber and configured to transport the first substrate between the first loadlock apparatus and the processing chamber, wherein the first loadlock apparatus includes: a loadlock chamber including a first accommodation space, and a second accommodation space above the first accommodation space, the first accommodation space having a first opening, and the second accommodation space having a second opening; a first valve plate configured to move between a first open position where the first opening is open and a first closed position where the first opening is closed, wherein the first valve plate is configured to move to the first open position in a first vertical direction; and a second valve plate configured to move between a second open position where the second opening is open and a second closed position where the second opening is closed, wherein the second valve plate is configured to move to the second open position in a second vertical direction opposite to the first vertical direction, wherein the first valve plate and the second valve plate vertically overlap, and wherein the first opening and the second opening are in a first surface of the loadlock chamber facing the first chamber.

According to the inventive concept, a substrate processing method includes: loading a carrier, which has a substrate loaded therein, on a load port at a side part of a chamber; transporting the substrate from the carrier to a loadlock apparatus via a first substrate transport robot configured to move vertically inside the chamber; transporting the substrate from the loadlock apparatus to a processing chamber via a second substrate transport robot in a substrate transport chamber connected to the loadlock apparatus; and processing the substrate inside the processing chamber, wherein the loadlock apparatus includes: a loadlock chamber including a first accommodation space, and a second accommodation space above the first accommodation space, wherein the first accommodation space has a first opening, and wherein the second accommodation space has a second opening; a first slit valve including a first valve plate configured to open and close the first opening, and a first actuator configured to move the first valve plate between a first open position where the first opening is open and a first closed position where the first opening is closed, wherein the first valve plate is configured to move to the first open position in a first vertical direction; and a second slit valve including a second valve plate configured to open and close the second opening, and a second actuator configured to move the second valve plate between a second open position where the second opening is open and a second closed position where the second opening is closed, wherein the second valve plate is configured to move to the second open position in a second vertical direction opposite to the first vertical direction, wherein the first opening and the second opening are in one side surface of the loadlock chamber facing the chamber, and wherein the transporting of the substrate from the carrier to the loadlock apparatus includes moving at least one of the first valve plate and the second valve plate so that at least one of the first opening and the second opening is open.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
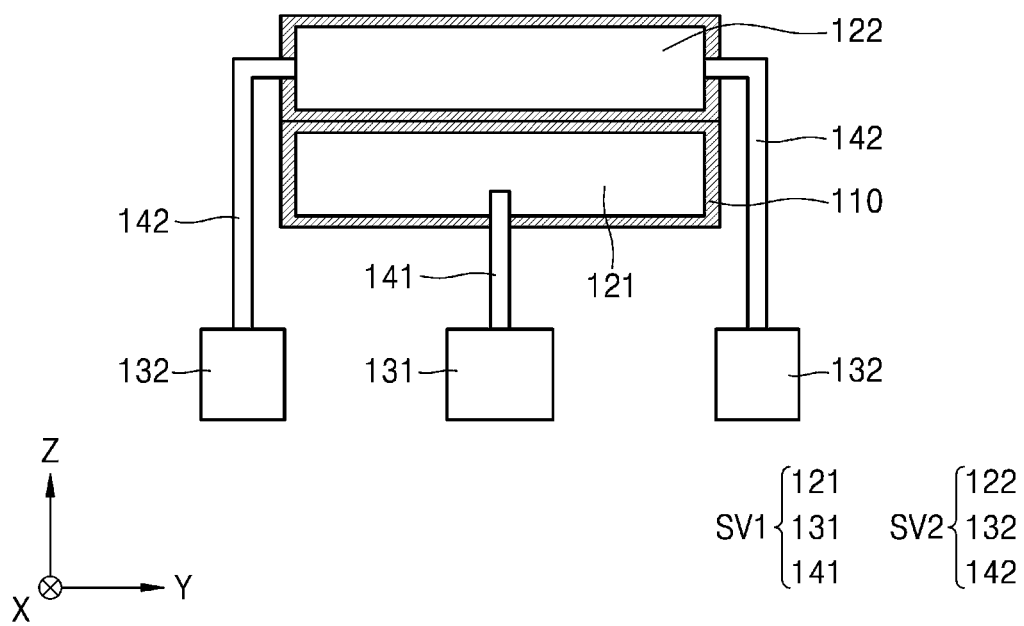
FIGS. 1A to 1D illustrate a loadlock apparatus according to example embodiments of the inventive concept.

Hereinafter, embodiments of the inventive concept are described in detail with reference to the accompanying drawings. Like reference numerals in the drawings denote like elements, and thus their repetitive description will be omitted.

FIGS. 1A to 1D are cross-sectional views illustrating a loadlock apparatus 100 according to example embodiments of the inventive concept.

Figure 1B:
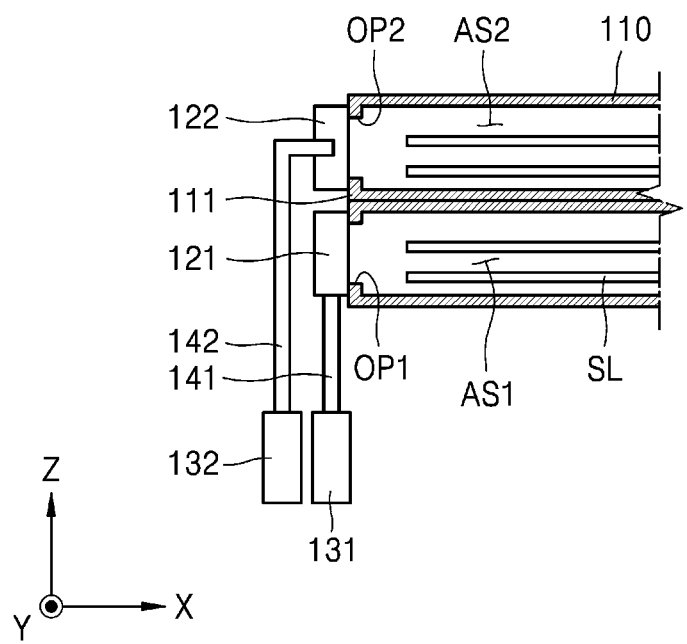
Figure 1C:
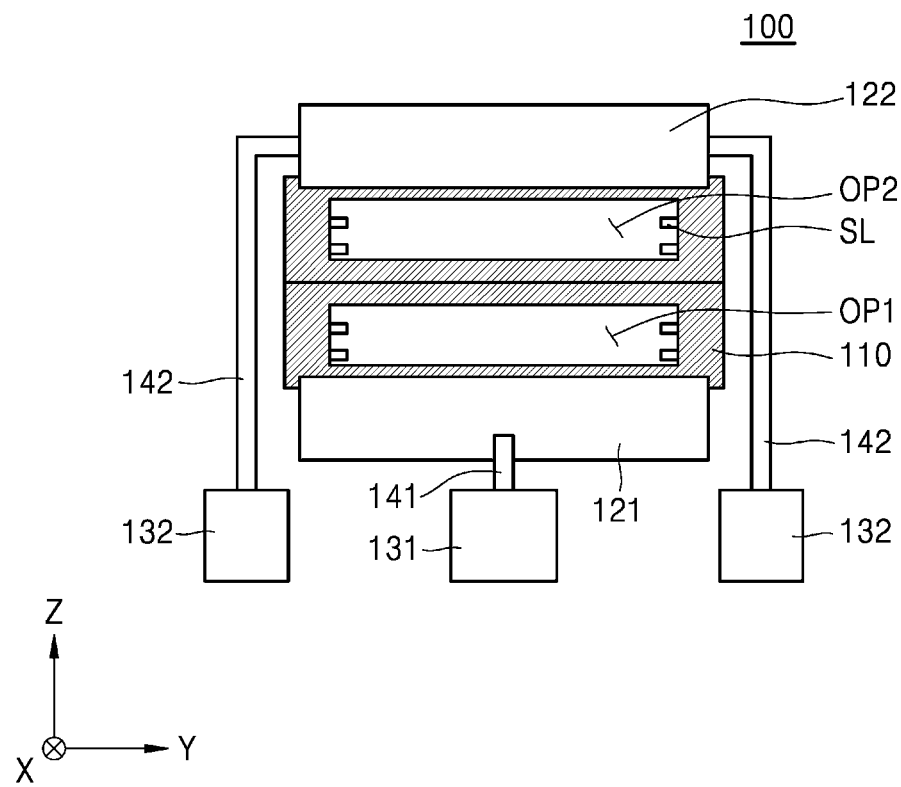
Figure 1D:
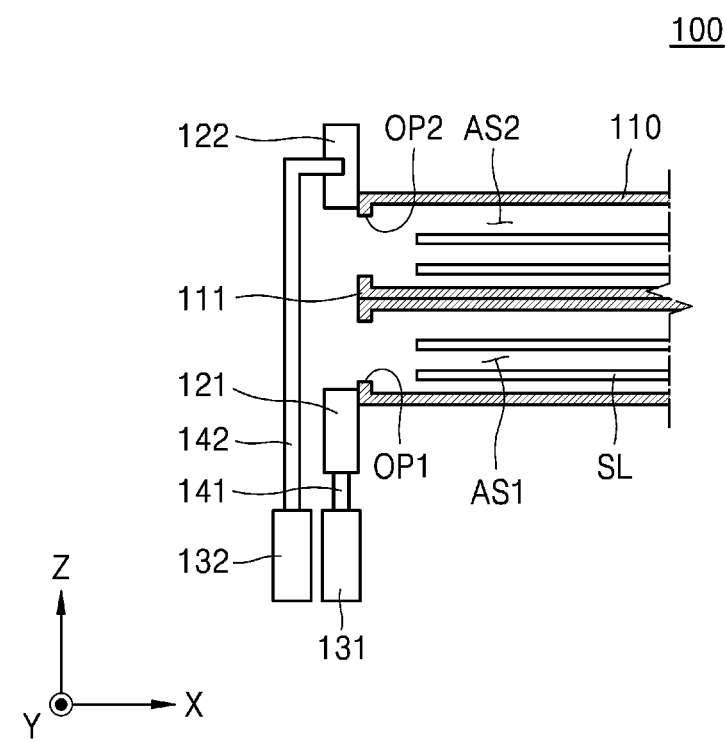

Particularly, FIGS. 1A and 1B are respectively a front view and a cross-sectional view illustrating the loadlock apparatus 100 when both a first valve plate 121 and a second valve plate 122 are at closed positions. FIGS. 1C and 1D are respectively a front view and a cross-sectional view illustrating the loadlock apparatus 100 when both the first valve plate 121 and the second valve plate 122 are at open positions.

Referring to FIGS. 1A to 1D, the loadlock apparatus 100 may include a loadlock chamber 110, a first slit valve SV1, and a second slit valve SV2.

The loadlock chamber 110 may include a first accommodation space AS1 and a second accommodation space AS2 separated from each other. The second accommodation space AS2 may be on the first accommodation space AS1. The first accommodation space AS1 and the second accommodation space AS2 may be configured to accommodate a substrate therein. A slot SL, which supports a substrate such as a semiconductor wafer, may be in the first accommodation space AS1 and the second accommodation space AS2.

The loadlock apparatus 100 may independently adjust internal pressure of the first accommodation space AS1 and internal pressure of the second accommodation space AS2. For example, the loadlock apparatus 100 may be configured to adjust each of the internal pressure of the first accommodation space AS1 and the internal pressure of the second accommodation space AS2 to be between a first pressure and a second pressure. In example embodiments, the first pressure may be atmospheric pressure or at a level close to the same. In example embodiments, the second pressure is less than the first pressure and may be vacuum pressure. For example, the second pressure may be about 10 Torr or less, about $10^{-1}$ Torr or less, or about $10^{-3}$ Torr or less.

The loadlock apparatus 100 may include a vacuum pump (not shown) configured to discharge gas in the first accommodation space AS1 and gas in the second accommodation space AS2, and a gas supply source configured to supply purge gas (e.g., nitrogen gas, inert gas, and/or clean dry air) to the first accommodation space AS1 and the second accommodation space AS2. The vacuum pump may discharge the gas in the first accommodation space AS1 and the gas in the second accommodation space AS2 through exhaust pipes respectively connected to the first accommodation space AS1 and the second accommodation space AS2. The vacuum pump may exhaust the first accommodation space AS1 and the second accommodation space AS2 to decrease the internal pressure of the first accommodation space AS1 and the internal pressure of the second accommodation space AS2. The gas supply source may supply purge gas to the first accommodation space AS1 and the second accommodation space AS2 through a diffuser in the first accommodation space AS1 and the second accommodation space AS2. For example, the gas supply source may supply purge gas to the first accommodation space AS1 and the second accommodation space AS2 to increase the internal pressure of the first accommodation space AS1 and the internal pressure of the second accommodation space AS2. The loadlock apparatus 100 may adjust the internal pressure of the first accommodation space AS1 and the internal pressure of the second accommodation space AS2 by using the vacuum pump and the gas supply source.

A first opening OP1 communicating with the first accommodation space AS1 and a second opening OP2 communicating with the second accommodation space AS2 may be in a first surface 111 of the loadlock chamber 110. The second opening OP2 may be above the first opening OP1. The first opening OP1 is an entrance or an exit of the first accommodation space AS1, and a substrate is loaded in or unloaded from the first accommodation space AS1 through the first opening OP1. The second opening OP2 is an entrance or an exit of the second accommodation space AS2, and a substrate is loaded in or unloaded from the second accommodation space AS2 through the second opening OP2.

Each of the first opening OP1 and the second opening OP2 may have a rectangular shape in which a vertical height thereof (i.e., a length in a vertical direction (e.g., a Z direction)) is less than a horizontal width thereof (i.e., a length in a first horizontal direction (e.g., a Y direction)). The first opening OP1 and the second opening OP2 may have the same dimensions. The vertical height of the first opening OP1 may be the same as the vertical height of the second opening OP2, and the horizontal width of the first opening OP1 may be the same as the horizontal width of the second opening OP2.

The first slit valve SV1 may be configured to open and close the first opening OP1 of the loadlock chamber 110. For example, the first slit valve SV1 may open the first opening OP1 to load or unload a substrate, and close the first opening OP1 to seal the first accommodation space AS1. The first slit valve SV1 may include the first valve plate 121, a first actuator 131, and a first elevation rod 141.

The first valve plate 121 may have a vertical height that is greater than the vertical height of the first opening OP1 and a horizontal width that is greater than the horizontal width of the first opening OP1 to close the first opening OP1. The first valve plate 121 may have a rectangular shape in which a horizontal width thereof is greater than a vertical height thereof.

The first actuator 131 is under the first valve plate 121, and the first elevation rod 141 may extend between (i.e., connect) the first valve plate 121 and the first actuator 131.

For example, the first elevation rod 141 may be coupled to a central part of the first valve plate 121 and extend downward from the central part of the first valve plate 121 to the first actuator 131. The first elevation rod 141 is moved in the vertical direction (e.g., the Z direction) by the first actuator 131, and accordingly, the first valve plate 121 coupled to the first elevation rod 141 moves in the vertical direction (e.g., the Z direction). For example, the first actuator 131 may include at least one of a motor, a hydraulic cylinder, and a pneumatic cylinder.

The first actuator 131 may move the first valve plate 121 to slide between a first closed position where the first opening OP1 is closed and a first open position where the first opening OP1 is opened. The first open position may be a position moved downward from the first closed position. When the first valve plate 121 is at the first closed position, the first valve plate 121 may be in close contact with the first surface 111 of the loadlock chamber 110 and close the first opening OP1. When the first valve plate 121 is at the first open position, the first opening OP1 may be exposed. A stroke of the first valve plate 121 (i.e., a moving distance of the first valve plate 121 between the first open position and the first closed position) may be approximately similar to the vertical height of the first valve plate 121.

The second slit valve SV2 may be configured to open and close the second opening OP2 of the loadlock chamber 110. For example, the second slit valve SV2 may open the second opening OP2 to load or unload a substrate, and close the second opening OP2 to seal the second accommodation space AS2. The second slit valve SV2 may include the second valve plate 122, a second actuator 132, and a second elevation rod 142.

The second valve plate 122 may have a vertical height that is greater than the vertical height of the second opening OP2 and a horizontal width that is greater than the horizontal width of the second opening OP2 to close the second opening OP2. The second valve plate 122 may have a rectangular shape in which a horizontal width thereof is greater than a vertical height thereof. The vertical height and the horizontal width of the second valve plate 122 may be the same as the vertical height and the horizontal width of the first valve plate 121, respectively. The second valve plate 122 may be aligned (i.e., vertically overlap) with the first valve plate 121 in the vertical direction (e.g., the Z direction), as illustrated in FIG. 1B.

The second actuator 132 is below the first valve plate 121, and the second elevation rod 142 may extend between (i.e., connect) the second valve plate 122 and the second actuator 132. The second elevation rod 142 is moved in the vertical direction (e.g., the Z direction) by the second actuator 132, and accordingly, the second valve plate 122 coupled to the second elevation rod 142 moves in the vertical direction (e.g., the Z direction). For example, the second actuator 132 may include at least one of a motor, a hydraulic cylinder, and a pneumatic cylinder.

The second actuator 132 may move the second valve plate 122 to slide between a second closed position where the second opening OP2 is closed and a second open position where the second opening OP2 is opened. The second open position may be a position moved upward from the second closed position. When the second valve plate 122 is at the second closed position, the second valve plate 122 may be in close contact with the first surface 111 of the loadlock chamber 110 and close the second opening OP2. When the second valve plate 122 is at the second open position, the second opening OP2 may be exposed. A stroke of the second valve plate 122 (i.e., a moving distance of the second valve plate 122 between the second open position and the second closed position) may be approximately similar to the vertical height of the second valve plate 122.

In example embodiments, the second elevation rod 142 may be coupled to each of two opposite side parts of the second valve plate 122. To prevent the second elevation rod 142 from being physically interfered with the first valve plate 121 and/or the first elevation rod 141, the second elevation rod 142 may extend in a lateral direction (e.g., the Y direction) from each of the two opposite side parts of the second valve plate 122 and be spaced apart from two opposite side parts of the first valve plate 121 in the lateral direction (e.g., the Y direction).

The loadlock apparatus 100 may individually control a position of the first valve plate 121 and a position of the second valve plate 122. The loadlock apparatus 100 may control the position of the first valve plate 121 and the position of the second valve plate 122 to open both the first opening OP1 and the second opening OP2, close both the first opening OP1 and the second opening OP2, or open only any one of the first opening OP1 and the second opening OP2.

According to example embodiments, because a moving direction of the first valve plate 121 to change from the first closed position to the first open position is opposite to a moving direction of the second valve plate 122 to change from the second closed position to the second open position, an open/close operation of the first valve plate 121 and an open/close operation of the second valve plate 122 may be performed without interference therebetween. In addition, a moving trajectory of the first valve plate 121 is determined not to interfere with a substrate from being loaded in or unloaded from the second accommodation space AS2, and a moving trajectory of the second valve plate 122 is determined not to interfere with a substrate from being loaded in or unloaded from the first accommodation space AS1. In example embodiments, both the first opening OP1 and the second opening OP2 may be opened so that substrates are simultaneously loaded in and out through the first opening OP1 and the second opening OP2. According to example embodiments of the inventive concept, the loadlock apparatus 100 may use, as a loadlock space, all of a plurality of accommodation spaces stacked in the vertical direction (e.g., the Z direction), and thus, a delay in the loadlock apparatus 100 may be reduced, and the productivity of equipment may be improved without increasing a footprint of the loadlock apparatus 100.

FIGS. 2A to 2D illustrate a loadlock apparatus 101 according to example embodiments of the inventive concept.

Figure 2A:
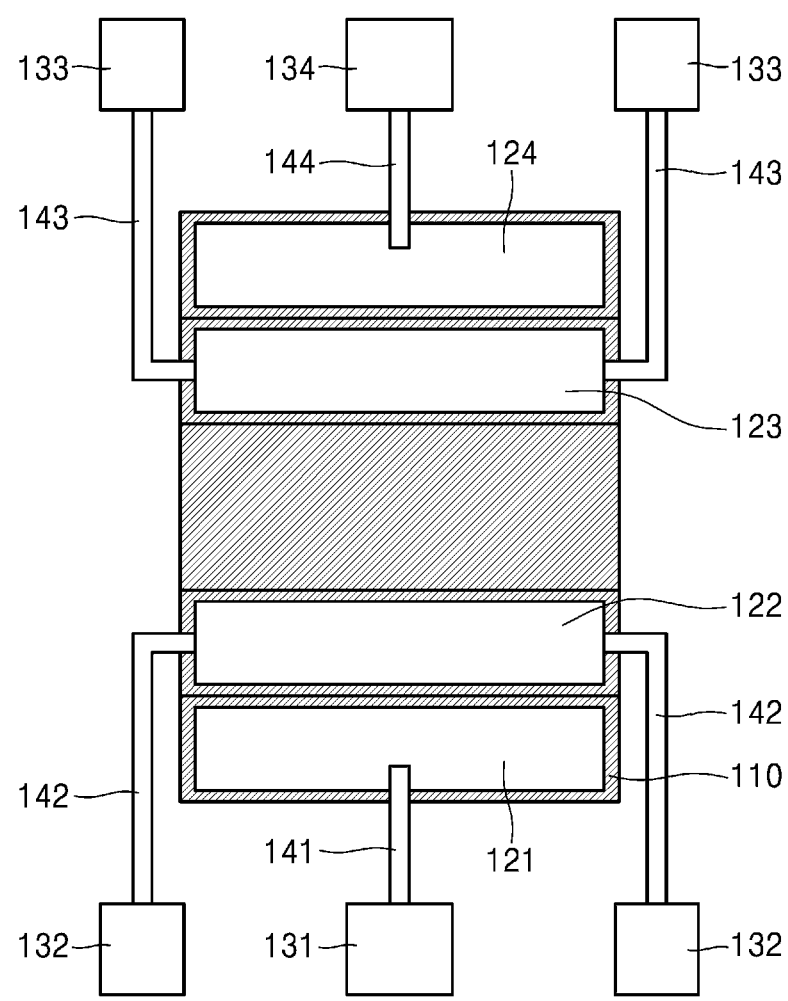
FIGS. 2A to 2D illustrate a loadlock apparatus according to example embodiments of the inventive concept.
Figure 2B:
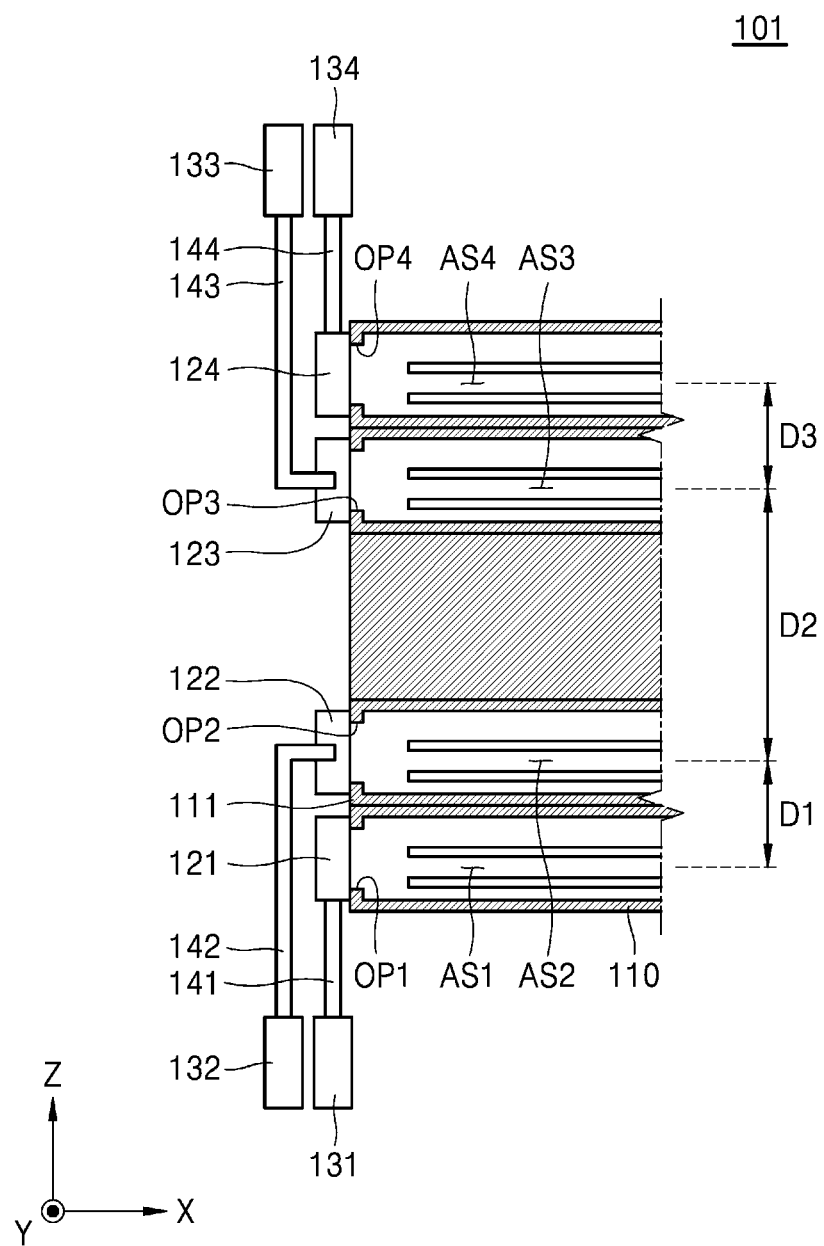
Figure 2C:
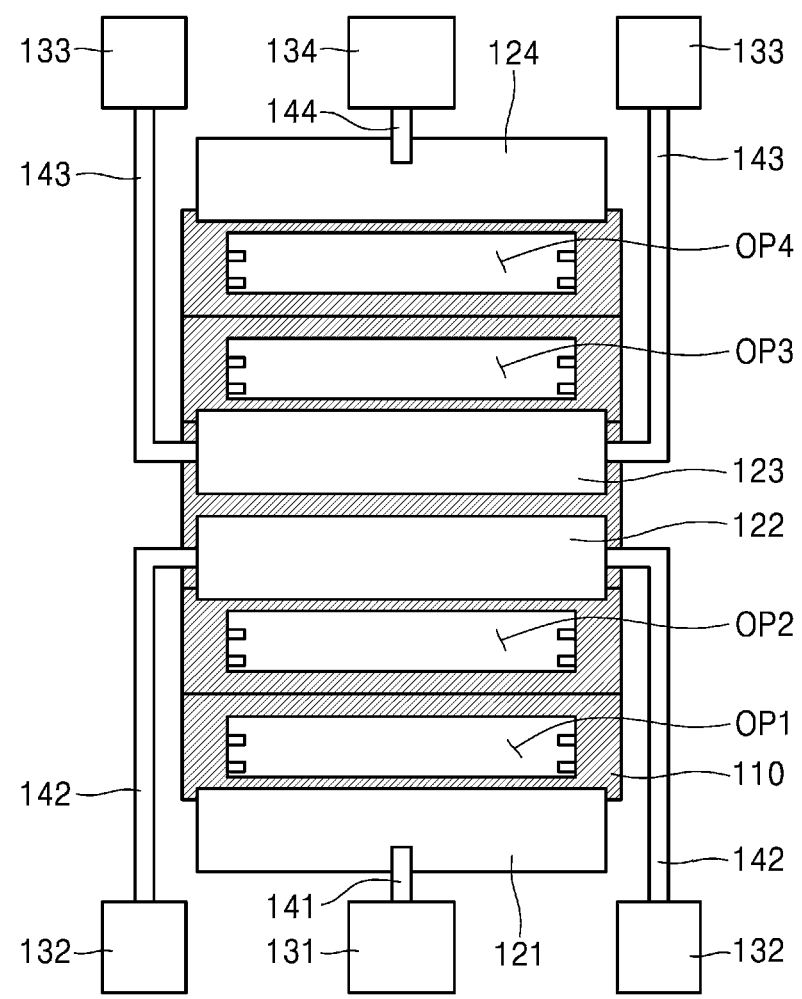
Figure 2D:
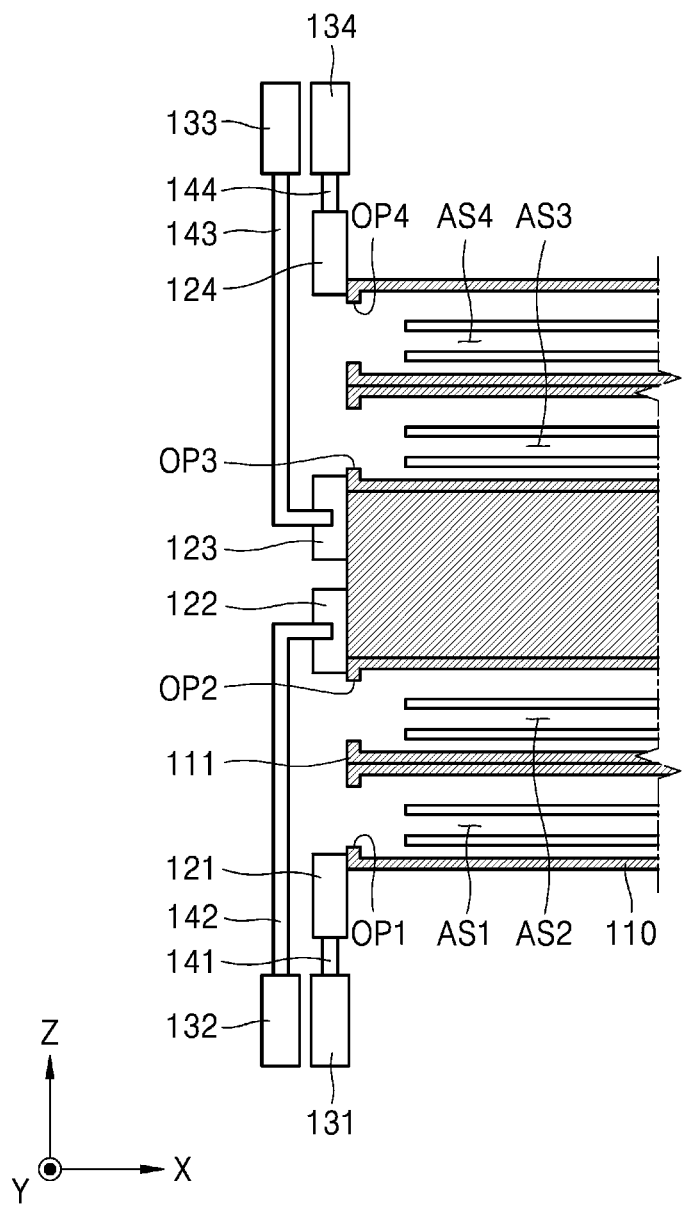

Particularly, FIGS. 2A and 2B are respectively a front view and a cross-sectional view illustrating the loadlock apparatus 101 when both the first valve plate 121 and the second valve plate 122 are at the closed positions. FIGS. 2C and 2D are respectively a front view and a cross-sectional view illustrating the loadlock apparatus 101 when both the first valve plate 121 and the second valve plate 122 are at the open positions.

The loadlock apparatus 101 shown in FIGS. 2A to 2D may be generally the same as or similar to the loadlock apparatus 100 described with reference to FIGS. 1A to 1D except that the former further includes a third slit valve SV3 configured to open and close a third opening OP3 of the loadlock chamber 110, and a fourth slit valve SV4 configured to open and close a fourth opening OP4 of the loadlock chamber 110. Hereinafter, the loadlock apparatus 101 shown in FIGS. 2A to 2D is descried by mainly describing differences from the loadlock apparatus 100 described with reference to FIGS. 1A to 1D.

Referring to FIGS. 2A to 2D, the loadlock apparatus 101 may include the loadlock chamber 110, the first slit valve SV1, the second slit valve SV2, the third slit valve SV3, and the fourth slit valve SV4.

The loadlock chamber 110 may further include a third accommodation space AS3 and a fourth accommodation space AS4 separated from each other. The third accommodation space AS3 may be above the second accommodation space AS2, and the fourth accommodation space AS4 may be above the third accommodation space AS3. The third accommodation space AS3 and the fourth accommodation space AS4 may be configured to accommodate a substrate therein. The slot SL, which supports a substrate, may be in the third accommodation space AS3 and the fourth accommodation space AS4.

The loadlock apparatus 101 may independently adjust internal pressure of each of the first to fourth accommodation spaces AS1, AS2, AS3, and AS4. The loadlock apparatus 101 may independently adjust the internal pressure of each of the first to fourth accommodation spaces AS1, AS2, AS3, and AS4 by using a vacuum pump configured to exhaust the first to fourth accommodation spaces AS1, AS2, AS3, and AS4 and a gas supply source configured to supply purge gas to the first to fourth accommodation spaces AS1, AS2, AS3, and AS4. The internal pressure of each of the first to fourth accommodation spaces AS1, AS2, AS3, and AS4 may be adjusted between the first pressure and the second pressure. The first pressure may be the atmospheric pressure or at a level close to the same, and the second pressure may be the vacuum pressure.

The third opening OP3 communicating with the third accommodation space AS3 and the fourth opening OP4 communicating with the fourth accommodation space AS4 may be in the first surface 111 of the loadlock chamber 110. Each of the third opening OP3 and the fourth opening OP4 is an entrance or an exit through which a substrate is loaded or unloaded. The fourth opening OP4 may be above the third opening OP3. Each of the third opening OP3 and the fourth opening OP4 may have a rectangular shape in which a vertical height thereof is less than a horizontal width thereof. The first to fourth openings OP1, OP2, OP3, and OP4 may have the same dimensions (e.g., a vertical height and a horizontal width).

In example embodiments, a first distance D1 between the center of the first opening OP1 and the center of the second opening OP2 in the vertical direction (e.g., the Z direction) may be the same as a third distance D3 between the center of the third opening OP3 and the center of the fourth opening OP4 in the vertical direction (e.g., the Z direction). In addition, a second distance D2 between the center of the second opening OP2 and the center of the third opening OP3 in the vertical direction (e.g., the Z direction) may be greater than the first distance D1 and the third distance D3.

The third slit valve SV3 may be configured to open and close the third opening OP3 of the loadlock chamber 110. For example, the third slit valve SV3 may open the third opening OP3 to load or unload a substrate, and close the third opening OP3 to seal the third accommodation space AS3. The third slit valve SV3 may include a third valve plate 123, a third actuator 133, and a third elevation rod 143.

The third valve plate 123 may have a vertical height that is greater than the vertical height of the third opening OP3 and a horizontal width that is greater than the horizontal width of the third opening OP3 to close the third opening OP3. The third valve plate 123 may have a rectangular shape in which a horizontal width thereof is greater than a vertical height thereof. The vertical height and the horizontal width of the third valve plate 123 may be the same as the vertical height and the horizontal width of the second valve plate 122, respectively. The third valve plate 123 may be aligned (i.e., vertically overlap) with the second valve plate 122 in the vertical direction (e.g., the Z direction), as illustrated in FIG. 2B.

The third actuator 133 may be above the third valve plate 123, and the third elevation rod 143 may extend between (i.e., connect) the third valve plate 123 and the third actuator 133. The third elevation rod 143 is moved in the vertical direction (e.g., the Z direction) by the third actuator 133, and accordingly, the third valve plate 123 coupled to the third elevation rod 143 moves in the vertical direction (e.g., the Z direction). For example, the third actuator 133 may include at least one of a motor, a hydraulic cylinder, and a pneumatic cylinder.

The third actuator 133 may move the third valve plate 123 to slide between a third closed position where the third opening OP3 is closed and a third open position where the third opening OP3 is opened. The third open position may be a position moved downward from the third closed position. When the third valve plate 123 is at the third closed position, the third valve plate 123 may be in close contact with the first surface 111 of the loadlock chamber 110 and close the third opening OP3. When the third valve plate 123 is at the third open position, the third opening OP3 may be exposed. A stroke of the third valve plate 123 (i.e., a moving distance of the third valve plate 123 between the third open position and the third closed position) may be approximately similar to the vertical height of the third valve plate 123.

In example embodiments, the third elevation rod 143 may be coupled to each of two opposite side parts of the third valve plate 123. To prevent the third elevation rod 143 from being physically interfered with a fourth valve plate 124 and/or a fourth elevation rod 144, the third elevation rod 143 may extend in the lateral direction (e.g., the Y direction) from each of the two opposite side parts of the third valve plate 123 and be spaced apart from two opposite side parts of the fourth valve plate 124 in the lateral direction (e.g., the Y direction).

In embodiments, because the second valve plate 122 and the third valve plate 123 are aligned (i.e., vertically overlap) with each other in the vertical direction (e.g., the Z direction), to prevent collision between the second valve plate 122 and the third valve plate 123, a moving trajectory of the second valve plate 122 and a moving trajectory of the third valve plate 123 may be determined not to overlap each other. For example, a distance between the second valve plate 122 at the second closed position and the third valve plate 123 at the third closed position may be determined to be twice or more the stroke of the second valve plate 122 (or the stroke of the third valve plate 123).

The fourth slit valve SV4 may be configured to open and close the fourth opening OP4 of the loadlock chamber 110. For example, the fourth slit valve SV4 may open the fourth opening OP4 to load or unload a substrate, and close the fourth opening OP4 to seal the fourth accommodation space AS4. The fourth slit valve SV4 may include the fourth valve plate 124, a fourth actuator 134, and the fourth elevation rod 144.

The fourth valve plate 124 may have a vertical height that is greater than the vertical height of the fourth opening OP4 and a horizontal width that is greater than the horizontal width of the fourth opening OP4 to close the fourth opening OP4. The fourth valve plate 124 may have a rectangular shape in which a horizontal width thereof is greater than a vertical height thereof.

The fourth actuator 134 may be above the fourth valve plate 124, and the fourth elevation rod 144 may extend between (i.e., connect) the fourth valve plate 124 and the fourth actuator 134. For example, the fourth elevation rod 144 may be coupled to a central part of the fourth valve plate 124 and extend upward from the central part of the fourth valve plate 124 to the fourth actuator 134. The fourth elevation rod 144 is moved in the vertical direction (e.g., the Z direction) by the fourth actuator 134, and accordingly, the fourth valve plate 124 coupled to the fourth elevation rod 144 moves in the vertical direction (e.g., the Z direction). For example, the fourth actuator 134 may include at least one of a motor, a hydraulic cylinder, and a pneumatic cylinder.

The fourth actuator 134 may move the fourth valve plate 124 to slide between a fourth closed position where the fourth opening OP4 is closed and a fourth open position where the fourth opening OP4 is opened. The fourth open position may be a position moved upward from the fourth closed position. When the fourth valve plate 124 is at the fourth closed position, the fourth valve plate 124 may be in close contact with the first surface 111 of the loadlock chamber 110 and close the fourth opening OP4. When the fourth valve plate 124 is at the fourth open position, the fourth opening OP4 may be exposed. A stroke of the fourth valve plate 124 (i.e., a moving distance of the fourth valve plate 124 between the fourth open position and the fourth closed position) may be approximately similar to the vertical height of the fourth valve plate 124.

The loadlock apparatus 101 may individually control positions of the first to fourth valve plates 121, 122, 123, and 124. The loadlock apparatus 101 may control the positions of the first to fourth valve plates 121, 122, 123, and 124 to open all of the first to fourth openings OP1, OP2, OP3, and OP4, close all of the first to fourth openings OP1, OP2, OP3, and OP4, or open at least one of the first to fourth openings OP1, OP2, OP3, and OP4. According to example embodiments, all of the first to fourth openings OP1, OP2, OP3, and OP4 may be opened to simultaneously load and unload substrates through the first to fourth openings OP1, OP2, OP3, and OP4.

Figure 3:
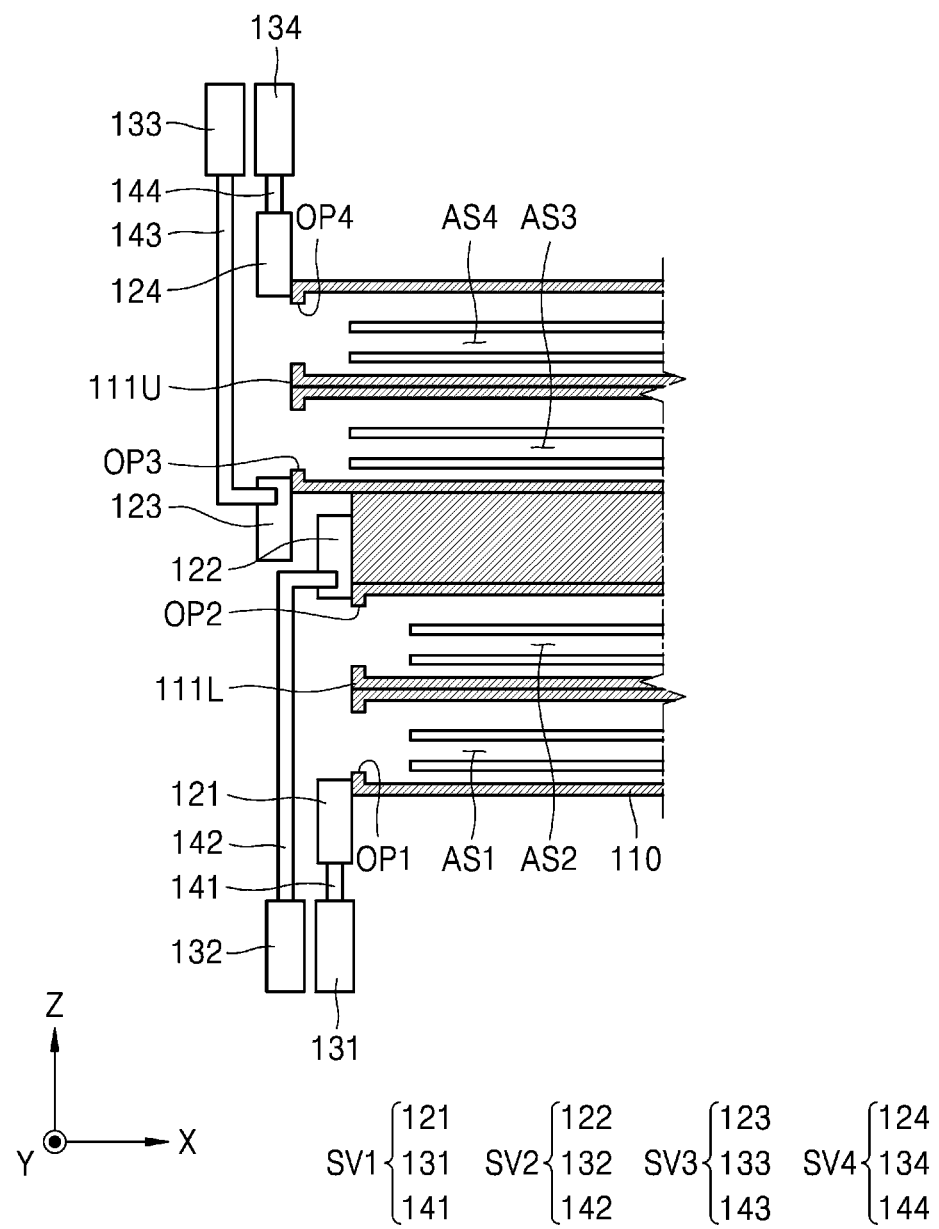
FIG. 3 is a cross-sectional view illustrating a loadlock apparatus according to example embodiments of the inventive concept.

FIG. 3 is a cross-sectional view illustrating a loadlock apparatus 102 according to example embodiments of the inventive concept.

Hereinafter, the loadlock apparatus 102 shown in FIG. 3 is described by mainly describing differences from the loadlock apparatus 101 described with reference to FIGS. 2A to 2D.

Referring to FIG. 3, a lower first surface 111L of the loadlock chamber 110, which is in contact with the first and second valve plates 121 and 122, and an upper first surface 111U of the loadlock chamber 110, which is in contact with the third and fourth valve plates 123 and 124, may be offset in a second horizontal direction (e.g., an X direction). That is, as shown in FIG. 3, the lower first surface 111L of the loadlock chamber 110 and the upper first surface 111U of the loadlock chamber 110 may have a level difference.

In addition, the second valve plate 122 and the third valve plate 123 may not be aligned (i.e., not vertically overlapped) with each other in the vertical direction (e.g., the Z direction) and may be offset in a direction that is perpendicular to a moving direction of the second valve plate 122 (or a moving direction of the third valve plate 123). That is, the second valve plate 122 and the third valve plate 123 may be offset (i.e., the second valve plate 122 and the third valve plate 123 are in adjacent, spaced apart relationship when in respective open positions) in the second horizontal direction (e.g., the X direction), as illustrated in FIG. 3. A distance between the second valve plate 122 at the second closed position and the third valve plate 123 at the third closed position may be one time to twice the stroke of the second valve plate 122 (or the stroke of the third valve plate 123), and the second valve plate 122 at the second open position and the third valve plate 123 at the third open position may overlap each other in the second horizontal direction (e.g., the X direction). In this case, even when the distance between the second valve plate 122 at the second closed position and the third valve plate 123 at the third closed position is one time to twice the stroke of the second valve plate 122 (or the stroke of the third valve plate 123), collision between the second valve plate 122 at the second open position and the third valve plate 123 at the third open position may be prevented.

Figure 4A:
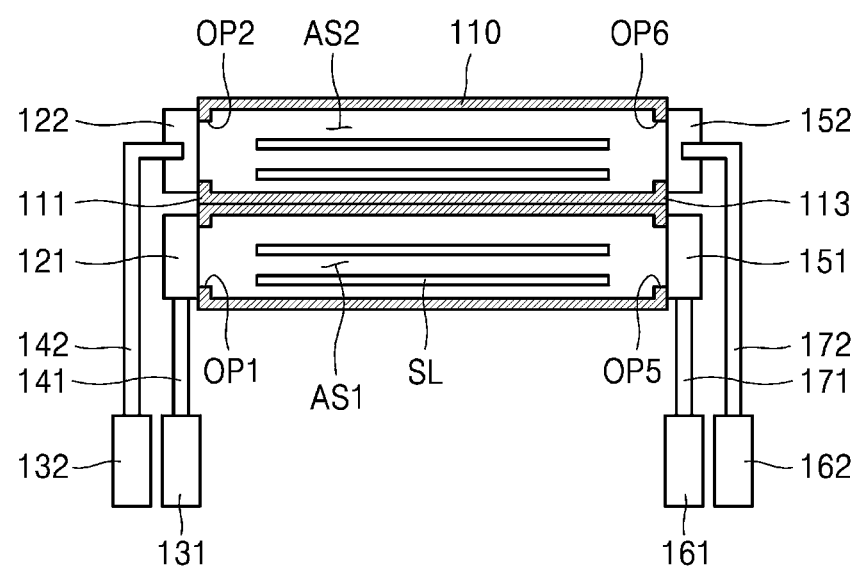
FIGS. 4A and 4B illustrate a loadlock apparatus according to example embodiments of the inventive concept.
Figure 4B:
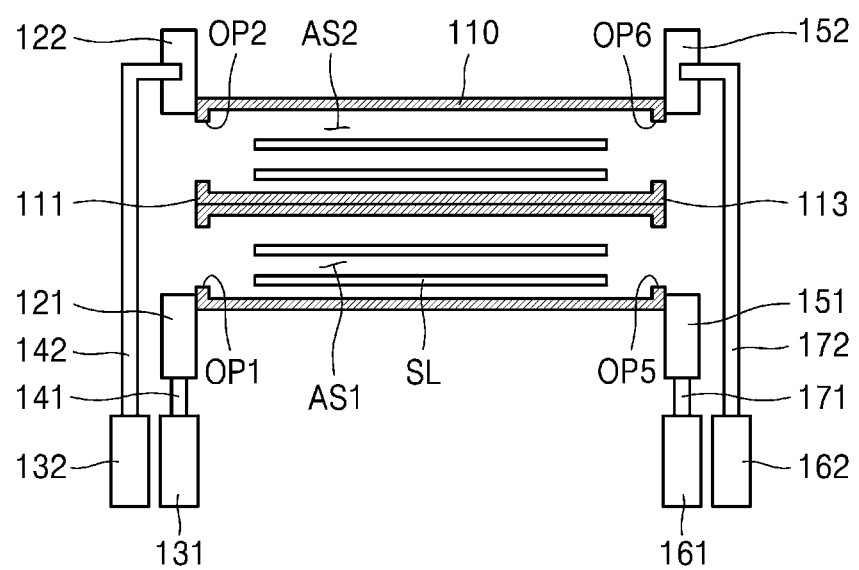

FIGS. 4A and 4B illustrate a loadlock apparatus 103 according to example embodiments of the inventive concept.

Particularly, FIG. 4A is a cross-sectional view illustrating the loadlock apparatus 103 when all of first, second, fifth, and sixth valve plates 121, 122, 151, and 152 are at closed positions, respectively, and FIG. 4B is a cross-sectional view illustrating the loadlock apparatus 103 when all of the first, second, fifth, and sixth valve plates 121, 122, 151, and 152 are at open positions, respectively.

Hereinafter, the loadlock apparatus 103 shown in FIGS. 4A and 4B is described by mainly describing differences from the loadlock apparatus 100 described with reference to FIGS. 1A to 1D.

Referring to FIGS. 4A and 4B, the loadlock chamber 110 may include a fifth opening OP5 communicating with the first accommodation space AS1 and a sixth opening OP6 communicating with the second accommodation space AS2. The fifth opening OP5 and the sixth opening OP6 may be in a second surface 113 of the loadlock chamber 110. The first opening OP1 may be an entrance or an exit at one end of the first accommodation space AS1, and the fifth opening OP5 may be an entrance or an exit at the other end of the first accommodation space AS1. The second opening OP2 may be an entrance or an exit at one end of the second accommodation space AS2, and the sixth opening OP6 may be an entrance or an exit at the other end of the second accommodation space AS2.

The loadlock apparatus 103 may include a fifth slit valve SV5 configured to open and close the fifth opening OP5 and a sixth slit valve SV6 configured to open and close the sixth opening OP6.

The fifth slit valve SV5 may include the fifth valve plate 151, a fifth actuator 161, and a fifth elevation rod 171. The fifth actuator 161 may move the fifth valve plate 151 to slide between a fifth closed position where the fifth opening OP5 is closed and a fifth open position where the fifth opening OP5 is opened. The fifth open position may be a position moved downward from the fifth closed position. The fifth actuator 161 may be under the fifth valve plate 151. The fifth open position may be at the same vertical level as the first open position, and the fifth closed position may be at the same vertical level as the first closed position. The fifth elevation rod 171 may be coupled to a central part of the fifth valve plate 151 and extend downward from the central part of the fifth valve plate 151 to the fifth actuator 161. A configuration and an operation of the fifth slit valve SV5 may be substantially the same as or similar to a configuration and an operation of the first slit valve SV1.

The sixth slit valve SV6 may include the sixth valve plate 152, a sixth actuator 162, and a sixth elevation rod 172. The sixth actuator 162 may move the sixth valve plate 152 to slide between a sixth closed position where the sixth opening OP6 is closed and a sixth open position where the sixth opening OP6 is opened. The sixth open position may be a position moved upward from the sixth closed position. The sixth open position may be at the same vertical level as the second open position, and the sixth closed position may be at the same vertical level as the second closed position. The sixth actuator 162 may be below the sixth valve plate 152. The sixth elevation rod 172 may extend between (i.e., connect) the sixth valve plate 152 and the sixth actuator 162. The sixth elevation rod 172 may be coupled to each of two opposite side parts of the sixth valve plate 152. To prevent the sixth elevation rod 172 from being physically interfered with the fifth valve plate 151 and/or the fifth elevation rod 171, the sixth elevation rod 172 may extend in the lateral direction (e.g., the Y direction) from each of the two opposite side parts of the sixth valve plate 152 and be spaced apart from two opposite side parts of the fifth valve plate 151 in the lateral direction (e.g., the Y direction). A configuration and an operation of the sixth slit valve SV6 may be substantially the same as or similar to a configuration and an operation of the second slit valve SV2.

The loadlock apparatus 103 may individually control a position of the fifth valve plate 151 and a position of the sixth valve plate 152. The loadlock apparatus 103 may control the position of the fifth valve plate 151 and the position of the sixth valve plate 152 to open both the fifth opening OP5 and the sixth opening OP6, close both the fifth opening OP5 and the sixth opening OP6, or open only any one of the fifth opening OP5 and the sixth opening OP6.

Figure 5A:
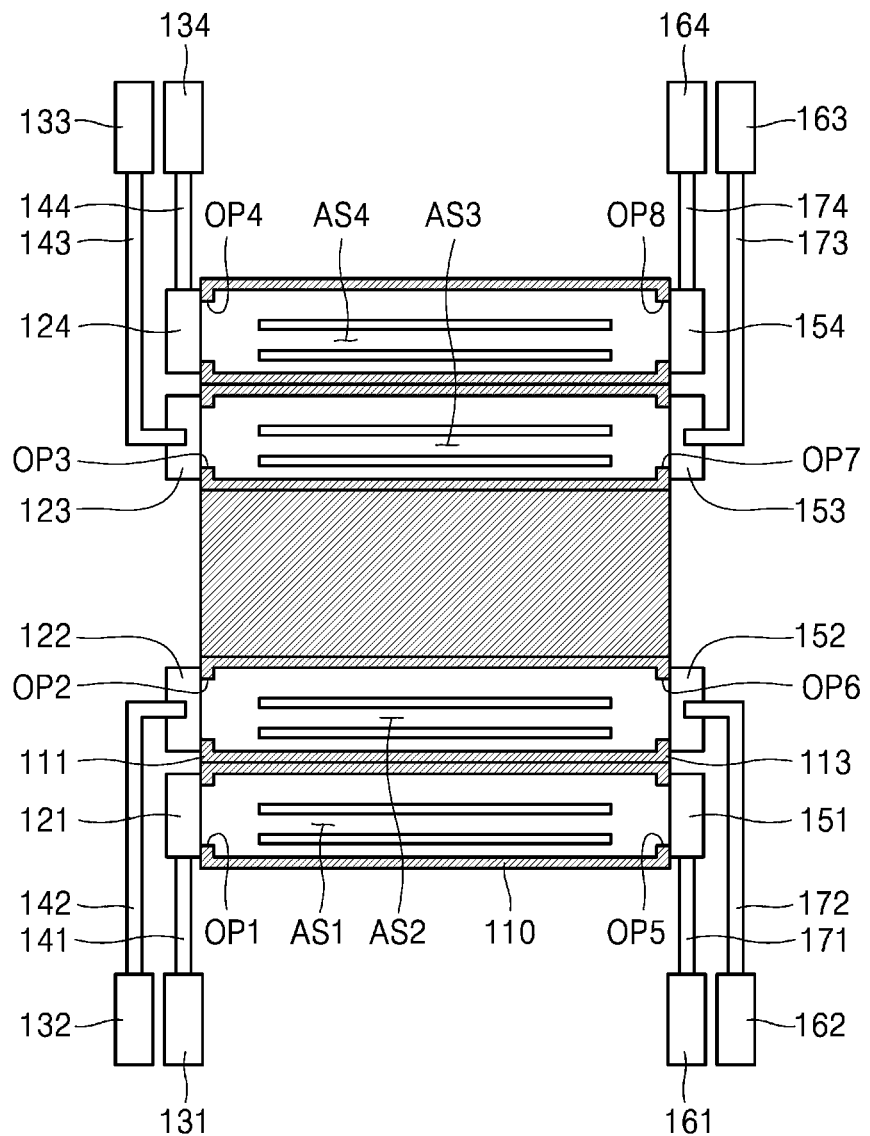
FIGS. 5A and 5B illustrate a loadlock apparatus according to example embodiments of the inventive concept.
Figure 5B:
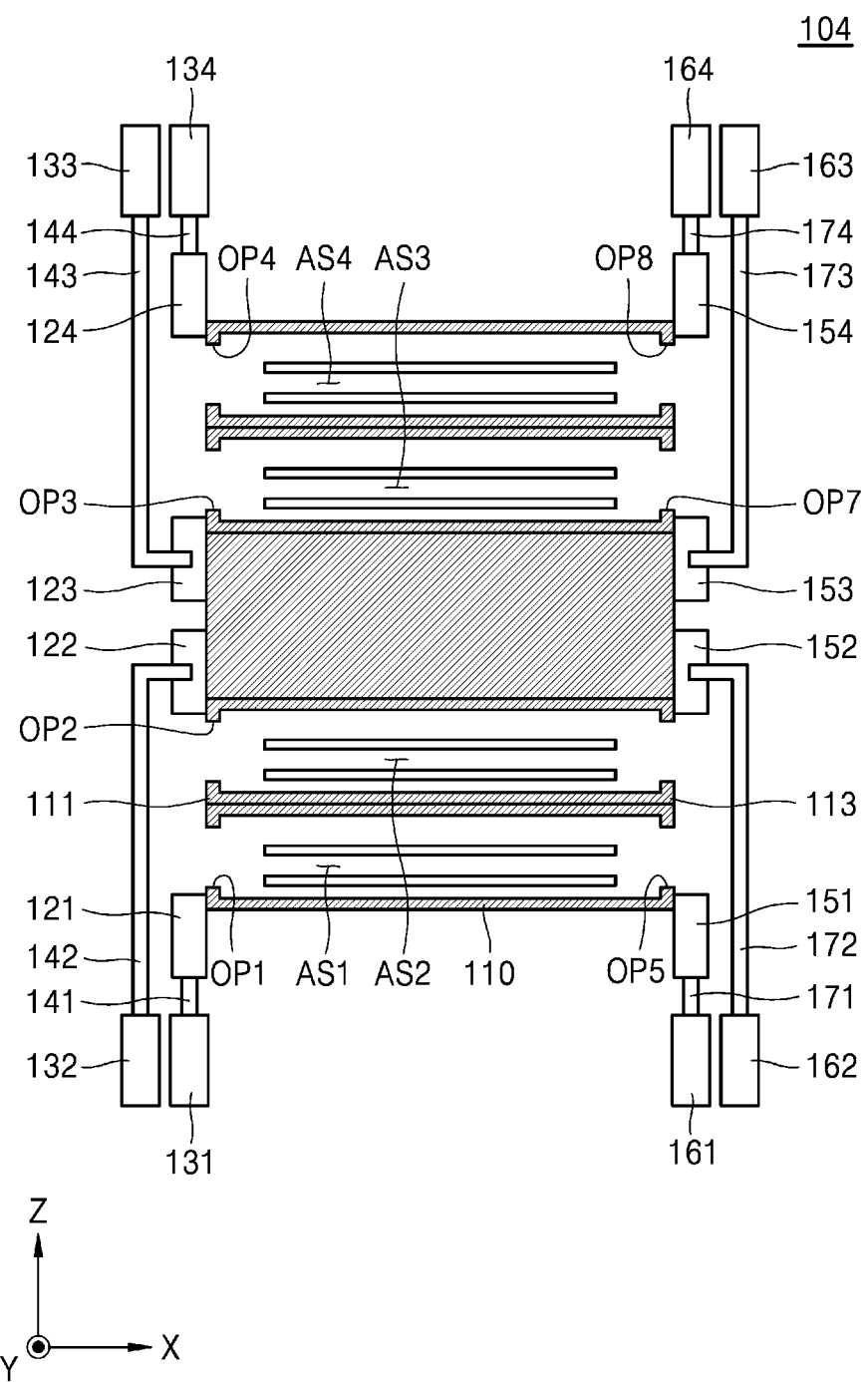

FIGS. 5A and 5B illustrate a loadlock apparatus 104 according to example embodiments of the inventive concept.

Particularly, FIG. 5A is a cross-sectional view illustrating the loadlock apparatus 104 when all of first to eighth valve plates 121, 122, 123, 124, 151, 152, 153, and 154 are at closed positions, respectively, and FIG. 5B is a cross-sectional view illustrating the loadlock apparatus 104 when all of the first to eighth valve plates 121, 122, 123, 124, 151, 152, 153, and 154 are at open positions, respectively.

Hereinafter, the loadlock apparatus 104 shown in FIGS. 5A and 5B is described by mainly describing differences from the loadlock apparatus 101 described with reference to FIGS. 2A to 2D and the loadlock apparatus 103 described with reference to FIGS. 4A and 4B.

Referring to FIGS. 5A and 5B, the loadlock chamber 110 may include a seventh opening OP7 communicating with the third accommodation space AS3 and an eighth opening OP8 communicating with the fourth accommodation space AS4. The seventh opening OP7 and the eighth opening OP8 may be in the second surface 113 of the loadlock chamber 110. The third opening OP3 may be an entrance or an exit at one end of the third accommodation space AS3, and the seventh opening OP7 may be an entrance or an exit at the other end of the third accommodation space AS3. The fourth opening OP4 may be an entrance or an exit at one end of the fourth accommodation space AS4, and the eighth opening OP8 may be an entrance or an exit at the other end of the fourth accommodation space AS4.

The loadlock apparatus 104 may include a seventh slit valve SV7 configured to open and close the seventh opening OP7 and an eighth slit valve SV8 configured to open and close the eighth opening OP8.

The seventh slit valve SV7 may include the seventh valve plate 153, a seventh actuator 163, and a seventh elevation rod 173. The seventh actuator 163 may move the seventh valve plate 153 to slide between a seventh closed position where the seventh opening OP7 is closed and a seventh open position where the seventh opening OP7 is opened. The seventh open position may be a position moved downward from the seventh closed position. The seventh actuator 163 may be above the seventh valve plate 153. The seventh open position may be at the same vertical level as the third open position, and the seventh closed position may be at the same vertical level as the third closed position. The seventh elevation rod 173 may be coupled to each of two opposite side parts of the seventh valve plate 153. To prevent the seventh elevation rod 173 from being physically interfered with the eighth valve plate 154 and/or an eighth elevation rod 174, the seventh elevation rod 173 may extend in the lateral direction (e.g., the Y direction) from each of the two opposite side parts of the seventh valve plate 153 and be spaced apart from two opposite side parts of the eighth valve plate 154 in the lateral direction (e.g., the Y direction). A configuration and an operation of the seventh slit valve SV7 may be substantially the same as or similar to a configuration and an operation of the third slit valve SV3.

The eighth slit valve SV8 may include the eighth valve plate 154, an eighth actuator 164, and the eighth elevation rod 174. The eighth actuator 164 may move the eighth valve plate 154 to slide between an eighth closed position where the eighth opening OP8 is closed and an eighth open position where the eighth opening OP8 is opened. The eighth open position may be a position moved upward from the eighth closed position. The eighth open position may be at the same vertical level as the fourth open position, and the eighth closed position may be at the same vertical level as the fourth closed position. The eighth actuator 164 may be above the eighth valve plate 154. The eighth elevation rod 174 may be coupled to a central part of the eighth valve plate 154 and extend upward from the central part of the eighth valve plate 154 to the eighth actuator 164. A configuration and an operation of the eighth slit valve SV8 may be substantially the same as or similar to a configuration and an operation of the fourth slit valve SV4.

The loadlock apparatus 104 may individually control positions of the fifth to eighth valve plates 151, 152, 153, and 154. The loadlock apparatus 104 may control the positions of the fifth to eighth valve plates 151, 152, 153, and 154 to open all of the fifth to eighth openings OP5, OP6, OP7, and OP8, close all of the fifth to eighth openings OP5, OP6, OP7, and OP8, or open at least one of the fifth to eighth openings OP5, OP6, OP7, and OP8. According to example embodiments, all of the fifth to eighth openings OP5, OP6, OP7, and OP8 may be opened to simultaneously load and unload substrates through the fifth to eighth openings OP5, OP6, OP7, and OP8.

Figure 6:
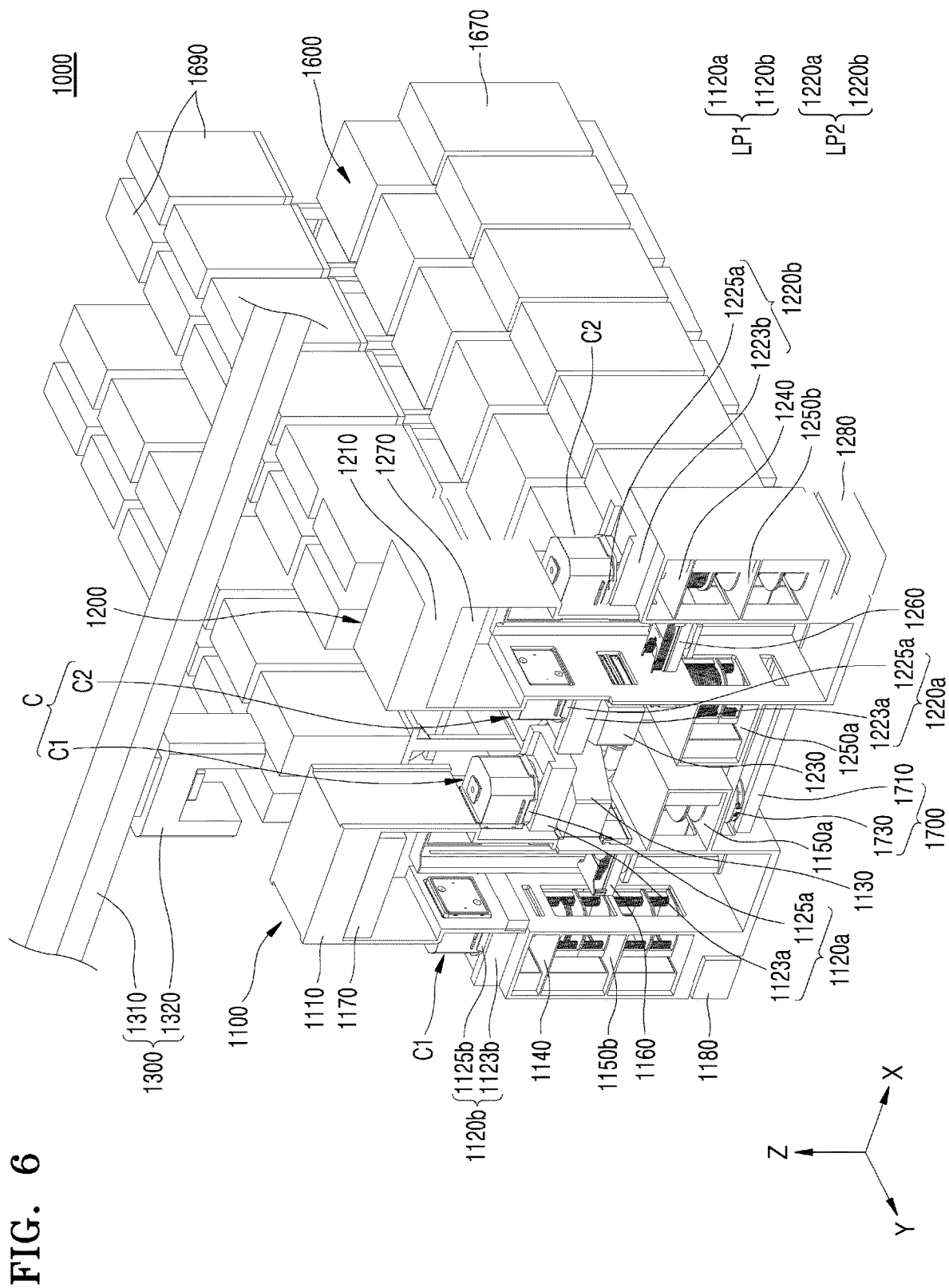
FIG. 6 is a perspective view illustrating a substrate processing apparatus according to example embodiments of the inventive concept.
Figure 7:
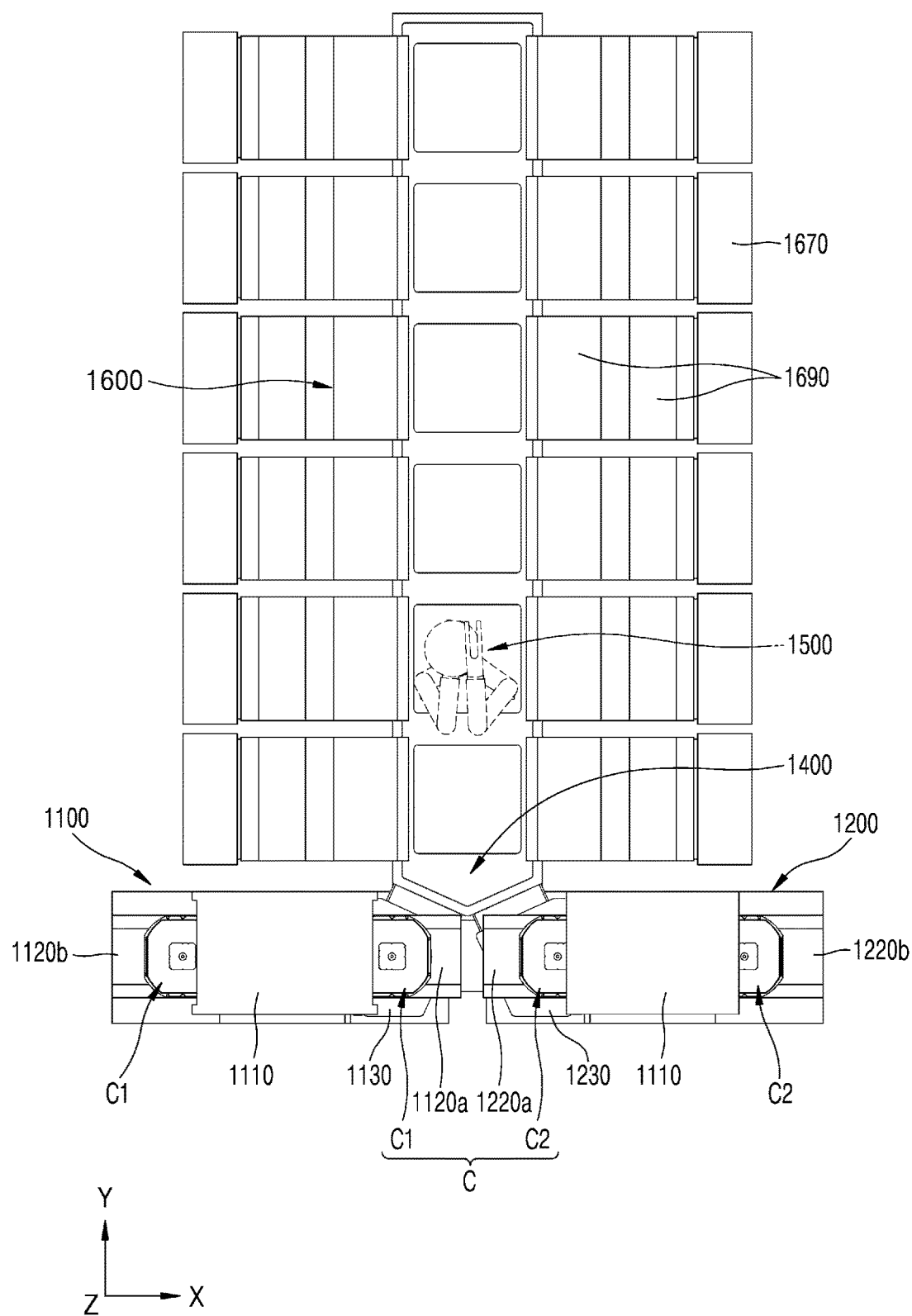
FIG. 7 is a top view illustrating the substrate processing apparatus of FIG. 6.
Figure 8:
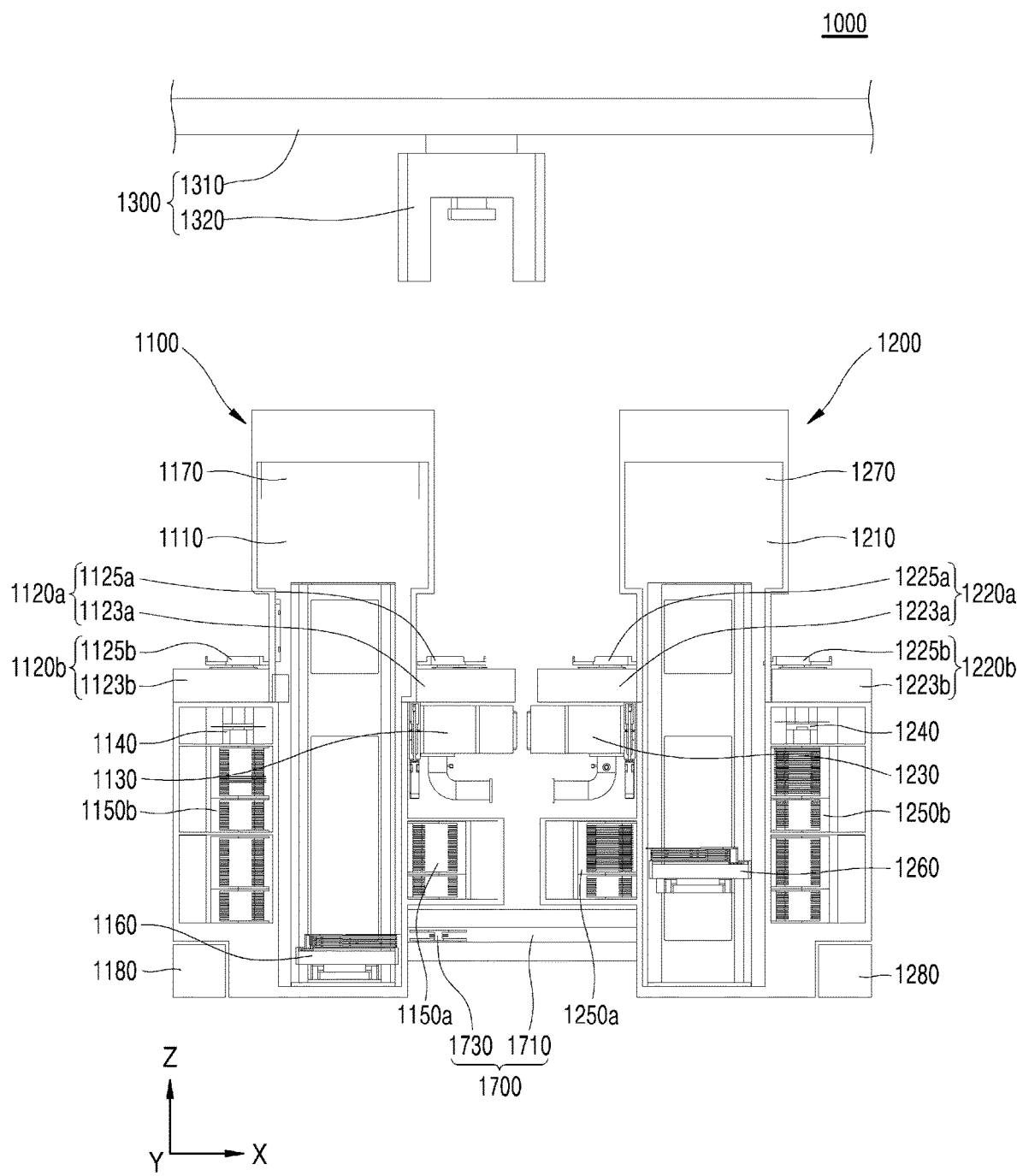
FIG. 8 is a front view illustrating the substrate processing apparatus of FIG. 6.

FIG. 6 is a perspective view illustrating a substrate processing apparatus 1000 according to example embodiments of the inventive concept, FIG. 7 is a top view illustrating the substrate processing apparatus 1000 of FIG. 6, and FIG. 8 is a front view illustrating the substrate processing apparatus 1000 of FIG. 6.

Referring to FIGS. 6 to 8, the substrate processing apparatus 1000 according to the inventive concept may include a first equipment front end module (EFEM) 1100, a second EFEM 1200, a carrier transport device 1300, a substrate transport chamber 1400, a substrate processing chamber 1600, an inter-EFEM connection device 1700, and the like.

The carrier transport device 1300 may be above the first EFEM 1100 and the second EFEM 1200 and configured to transport a carrier C. In example embodiments, the carrier C transported by the carrier transport device 1300 may include a front opening unified pod (FOUP) accommodating a plurality of substrates therein. The carrier transport device 1300 may transport the carrier C having substrates loaded therein to the first EFEM 1100 and/or the second EFEM 1200. In addition, the carrier transport device 1300 may receive the carrier C, in which processed substrates on which a substrate process is completed are loaded, from the first EFEM 1100 and/or the second EFEM 1200 and transport the received substrates to other equipment for a subsequent process.

The carrier transport device 1300 may include a transport rail 1310 and a carrier transport robot 1320. The transport rail 1310 may be above the first EFEM 1100 and the second EFEM 1200 and provide a moving path of the carrier transport robot 1320. For example, the transport rail 1310 may extend linearly above the first EFEM 1100 and the second EFEM 1200. In example embodiments, the transport rail 1310 may overlap the first EFEM 1100 and the second EFEM 1200 in a plan view and linearly extend in a horizontal direction (e.g., the X direction).

The carrier transport robot 1320 may transport the carrier C while moving along a transport path provided by the transport rail 1310. In addition, the carrier transport robot 1320 may be configured to move in the vertical direction (e.g., the Z direction). The carrier transport robot 1320 may pick up the carrier C on a plurality of first load ports LP1 of the first EFEM 1100 and a plurality of second load ports LP2 of the second EFEM 1200 and move the picked-up carrier C upward, or move a gripped carrier C downward to load the gripped carrier C on the plurality of first load ports LP1 of the first EFEM 1100 and the plurality of second load ports LP2 of the second EFEM 1200. In example embodiments, the carrier transport robot 1320 may include a gripping arm configured to grip the carrier C. In example embodiments, the carrier transport robot 1320 may be an overhead hoist transport (OHT).

The first EFEM 1100 may be configured to unload a first substrate from a first carrier C1 received from the carrier transport device 1300, align the first substrate, and transport the first substrate to the substrate transport chamber 1400. In addition, the first EFEM 1100 may be configured to receive the first substrate on which a substrate process is completed from the substrate transport chamber 1400, temporarily hold the first substrate, and load the first substrate in the first carrier C1.

The first EFEM 1100 may include a first chamber 1110, the plurality of first load ports LP1, a first loadlock apparatus 1130, a first substrate aligner 1140, first buffer devices 1150*a* and 1150*b*, a first substrate transport robot 1160, a first air supply device 1170, and a first vacuum pump 1180.

The first chamber 1110 may face a second chamber 1210 in the horizontal direction (e.g., the X direction). The first chamber 1110 may include an inner side surface facing the second chamber 1210 and an outer side surface that is opposite to the inner side surface. The first substrate transport robot 1160 may be located in an internal space of the first chamber 1110.

The plurality of first load ports LP1 may be at a side part of the first chamber 1110 and configured to support the first carrier C1. In addition, the plurality of first load ports LP1 may be configured to transport the first carrier C1 in the horizontal direction (e.g., the X direction) or rotate the first carrier C1 around a rotary axis that is parallel to the vertical direction (e.g., the Z direction).

The plurality of first load ports LP1 may include a first inner load port 1120*a* attached to the inner side surface of the first chamber 1110, and a first outer load port 1120*b* attached to the outer side surface of the first chamber 1110.

The first inner load port 1120*a* may include a first inner transport rail 1123*a* extending in the horizontal direction (e.g., the X direction) from the inner side surface of the first chamber 1110, and a first inner transport tray 1125*a* moving along the first inner transport rail 1123*a*. The first inner transport tray 1125*a* may be configured to support the first carrier C1 and move in the horizontal direction along the first inner transport rail 1123*a* or rotate around a rotary axis that is parallel to the vertical direction (e.g., the Z direction).

The first outer load port 1120*b* may include a first outer transport rail 1123*b* extending in the horizontal direction (e.g., the X direction) from the outer side surface of the first chamber 1110, and a first outer transport tray 1125*b* moving along the first outer transport rail 1123*b*. The first outer transport tray 1125*b* may be configured to support the first carrier C1 and move in the horizontal direction along the first outer transport rail 1123*b* or rotate around a rotary axis that is parallel to the vertical direction (e.g., the Z direction).

The first loadlock apparatus 1130 may be at the side part of the first chamber 1110 so as to overlap at least any one of the plurality of first load ports LP1 in the vertical direction (e.g., the Z direction). For example, the first loadlock apparatus 1130 may be connected to the inner side surface of the first chamber 1110 and overlap the first inner load port 1120*a* in the vertical direction (e.g., the Z direction). The first loadlock apparatus 1130 may be between the first chamber 1110 and the substrate transport chamber 1400 and provide a space in which the first substrate moves between the first chamber 1110 and the substrate transport chamber 1400. That is, the first substrate unloaded from the first chamber 1110 may be transported to the substrate transport chamber 1400 via the first loadlock apparatus 1130, and the first substrate unloaded from the substrate transport chamber 1400 may be transported to the first chamber 1110 via the first loadlock apparatus 1130.

The first loadlock apparatus 1130 may include an accommodation space accommodating the first substrate therein. The first loadlock apparatus 1130 may include a first loadlock chamber providing a plurality of accommodation spaces separated from each other and individually control internal pressure of each of the plurality of accommodation spaces in the first loadlock chamber. For example, the first loadlock apparatus 1130 may adjust the internal pressure of each of the plurality of accommodation spaces to be between the first pressure at the same or similar level as or to pressure of the internal space of the first chamber 1110 and the second pressure at the same or similar level as or to pressure of an internal space of the substrate transport chamber 1400. In example embodiments, the first pressure may be the atmospheric pressure or at a level close to the same. In example embodiments, the second pressure is less than the first pressure and may be the vacuum pressure. For example, the second pressure may be about 10 Torr or less, about $10^{-1}$ Torr or less, or about $10^{-3}$ Torr or less. In addition, the first loadlock apparatus 1130 may include a plurality of slit valves provided at one side surface of the first loadlock chamber facing the first chamber 1110 to open and close the plurality of accommodation spaces, and a plurality of slit valves provided at the other side surface of the first loadlock chamber facing the substrate transport chamber 1400 to open and close the plurality of accommodation spaces. In example embodiments, the first loadlock apparatus 1130 may correspond to any one of the loadlock apparatuses 100, 101, 102, 103, and 104 described with reference to FIGS. 1A to 5B.

The first vacuum pump 1180 may be connected to the first loadlock apparatus 1130, and adjust pressure of the plurality of accommodation spaces in the first loadlock apparatus 1130 by discharging air in the plurality of accommodation spaces in the first loadlock apparatus 1130. In example embodiments, the first vacuum pump 1180 may overlap the first outer load port 1120*b*, the first substrate aligner 1140, and a first outer buffer device 1150*b* in the vertical direction (e.g., the Z direction).

The first substrate aligner 1140 may be configured to align the first substrate in a preset direction. In example embodiments, the first substrate aligner 1140 may include a spinner configured to support the first substrate and rotate the first substrate so that the first substrate faces the preset direction. For example, the first substrate aligner 1140 may sense a notch formed on the first substrate and rotate the first substrate so that the sensed notch is aligned in the preset direction. In addition, the first substrate aligner 1140 may further include an air supply device configured to spray air toward the first substrate loaded on the spinner. The air supply device of the first substrate aligner 1140 may discharge air toward the first substrate to suppress attachment of particles onto the surface of the first substrate. The first substrate aligner 1140 may be connected to the side part of the first chamber 1110. The first substrate aligner 1140 may overlap at least any one of the plurality of first load ports LP1 in the vertical direction (e.g., the Z direction) and be connected to the side part of the first chamber 1110. For example, the first substrate aligner 1140 may overlap the first outer load port 1120*b* in the vertical direction (e.g., the Z direction).

The first buffer devices 1150*a* and 1150*b* may provide a buffer space configured to temporarily accommodate the first substrate therein. The first buffer devices 1150*a* and 1150*b* may further include an air supply device configured to supply air to a loaded substrate. The air supply device of the first buffer devices 1150*a* and 1150*b* may discharge air toward the first substrate to reduce attachment of particles onto the surface of the first substrate. The first buffer devices 1150*a* and 1150*b* may be connected to the side part of the first chamber 1110. For example, the first buffer devices 1150*a* and 1150*b* may overlap at least any one of the plurality of first load ports LP1 in the vertical direction (e.g., the Z direction).

In example embodiments, a plurality of first buffer devices 1150*a* and 1150*b* may be provided. For example, a first inner buffer device 1150*a* may overlap the first inner load port 1120*a* in the vertical direction (e.g., the Z direction) and be connected to the inner side surface of the first chamber 1110. The first inner buffer device 1150*a* may overlap the first loadlock apparatus 1130 in the vertical direction (e.g., the Z direction). The first outer buffer device 1150*b* may overlap the first outer load port 1120*b* in the vertical direction (e.g., the Z direction) and be connected to the outer side surface of the first chamber 1110.

The first substrate transport robot 1160 may move inside the first chamber 1110 and transport the first substrate. The first substrate transport robot 1160 may be configured to move in the vertical direction (e.g., the Z direction) along a vertical rail in the first chamber 1110. For example, the first substrate transport robot 1160 may include a robot arm and an end effector mounted on an end portion of the robot arm to hold the first substrate.

The first substrate transport robot 1160 may transport the first substrate among the first carrier C1, the first loadlock apparatus 1130, the first substrate aligner 1140, and the first buffer devices 1150*a* and 1150*b*. For example, the first substrate transport robot 1160 may be configured to unload the first substrate from the first carrier C1 and supply the first substrate to the first loadlock apparatus 1130, or unload the first substrate from the first loadlock apparatus 1130 and supply the first substrate to the first carrier C1. For example, the first substrate transport robot 1160 may unload the first substrate from the first carrier C1 and supply the first substrate to the first substrate aligner 1140, and unload the first substrate from the first substrate aligner 1140 and supply the first substrate to the first loadlock apparatus 1130. In addition, the first substrate transport robot 1160 may unload the first substrate from the first loadlock apparatus 1130 and supply the first substrate to the first buffer devices 1150*a* and 1150*b*, and unload the first substrate from the first buffer devices 1150*a* and 1150*b* and supply the first substrate to the first carrier C1.

The first air supply device 1170 may form a descending air current inside the first chamber 1110. The first air supply device 1170 may be configured to purify an internal space of the first chamber 1110. In example embodiments, the first air supply device 1170 may include a fan-filter unit (FFU) including a fan, an intake duct, an exhaust duct, a filter, and the like. In addition, the first air supply device 1170 may be configured to control humidity of the inside of the first chamber 1110.

The second EFEM 1200 may be separated from the first EFEM 1100 in the horizontal direction. In addition, the second EFEM 1200 may be configured to unload a second substrate from a second carrier C2 received from the carrier transport device 1300, align the second substrate, and transport the second substrate to the substrate transport chamber 1400. In addition, the second EFEM 1200 may be configured to receive the second substrate on which a substrate process is completed from the substrate transport chamber 1400, temporarily hold the second substrate, and load the second substrate in the second carrier C2.

The second EFEM 1200 may include the second chamber 1210, a plurality of second load ports LP2, a second loadlock apparatus 1230, a second substrate aligner 1240, second buffer devices 1250*a* and 1250*b*, a second substrate transport robot 1260, a second air supply device 1270, and a second vacuum pump 1280. Hereinafter, a description made with respect to the first EFEM 1100 is not repeated, and differences between the first EFEM 1100 and the second EFEM 1200 are mainly described.

The second chamber 1210 may face the first chamber 1110 in the horizontal direction (e.g., the X direction). The second chamber 1210 may include an inner side surface facing the first chamber 1110 and an outer side surface that is opposite to the inner side surface. The second substrate transport robot 1260 may be located in an internal space of the second chamber 1210.

The plurality of second load ports LP2 may be at a side part of the second chamber 1210 and configured to support the second carrier C2. In addition, the plurality of second load ports LP2 may be configured to transport the second carrier C2 in the horizontal direction (e.g., the X direction) or rotate the second carrier C2 around an axis that is parallel to the vertical direction (e.g., the Z direction).

The plurality of second load ports LP2 may include a second inner load port 1220*a* attached to the inner side surface of the second chamber 1210, and a second outer load port 1220*b* attached to the outer side surface of the second chamber 1210.

The second inner load port 1220*a* may include a second inner transport rail 1223*a* extending in the horizontal direction (e.g., the X direction) from the inner side surface of the second chamber 1210, and a second inner transport tray 1225*a* moving along the second inner transport rail 1223*a*. The second inner transport tray 1225*a* may be configured to support the second carrier C2 and move in the horizontal direction along the second inner transport rail 1223*a* or rotate around a rotary axis that is parallel to the vertical direction (e.g., the Z direction).

The second outer load port 1220*b* may include a second outer transport rail 1223*b* extending in the horizontal direction (e.g., the X direction) from the outer side surface of the second chamber 1210, and a second outer transport tray 1225*b* moving along the second outer transport rail 1223*b*. The second outer transport tray 1225*b* may be configured to support the second carrier C2 and move in the horizontal direction along the second outer transport rail 1223*b* or rotate around a rotary axis that is parallel to the vertical direction (e.g., the Z direction).

The second loadlock apparatus 1230 may be at the side part of the second chamber 1210 so as to overlap at least any one of the plurality of second load ports LP2 in the vertical direction (e.g., the Z direction). For example, the second loadlock apparatus 1230 may be connected to the inner side surface of the second chamber 1210 and overlap the second inner load port 1220*a* in the vertical direction (e.g., the Z direction). The second loadlock apparatus 1230 may be between the second chamber 1210 and the substrate transport chamber 1400 and provide a space in which the second substrate moves between the second chamber 1210 and the substrate transport chamber 1400. That is, the second substrate unloaded from the second chamber 1210 may be transported to the substrate transport chamber 1400 via the second loadlock apparatus 1230, and the second substrate unloaded from the substrate transport chamber 1400 may be transported to the second chamber 1210 via the second loadlock apparatus 1230.

The second loadlock apparatus 1230 may include an accommodation space accommodating the second substrate therein. The second loadlock apparatus 1230 may include a second loadlock chamber providing a plurality of accommodation spaces separated from each other and individually control internal pressure of each of the plurality of accommodation spaces in the second loadlock chamber. For example, the second loadlock apparatus 1230 may adjust the internal pressure of each of the plurality of accommodation spaces to be between the first pressure at the same or similar level as or to pressure of the internal space of the second chamber 1210 and the second pressure at the same or similar level as or to pressure of the internal space of the substrate transport chamber 1400. In example embodiments, the first pressure may be the atmospheric pressure or at a level close to the same. In addition, the second loadlock apparatus 1230 may include a plurality of slit valves provided at one side surface of the second loadlock chamber facing the second chamber 1210 to open and close the plurality of accommodation spaces, and a plurality of slit valves provided at the other side surface of the second loadlock chamber facing the substrate transport chamber 1400 to open and close the plurality of accommodation spaces. In example embodiments, the second loadlock apparatus 1230 may correspond to any one of the loadlock apparatuses 100, 101, 102, 103, and 104 described with reference to FIGS. 1A to 5B.

The second vacuum pump 1280 may be connected to the second loadlock apparatus 1230, and adjust pressure of the plurality of accommodation spaces in the second loadlock apparatus 1230 by discharging air in the plurality of accommodation spaces in the second loadlock apparatus 1230. In example embodiments, the second vacuum pump 1280 may overlap the second outer load port 1220*b*, the second substrate aligner 1240, and a second outer buffer device 1250*b* in the vertical direction (e.g., the Z direction).

The second substrate aligner 1240 may be configured to align the second substrate in a preset direction. In example embodiments, the second substrate aligner 1240 may include a spinner configured to support the second substrate and rotate the second substrate so that the second substrate faces the preset direction. In addition, the second substrate aligner 1240 may further include an air supply device configured to spray air toward the second substrate loaded on the spinner. The second substrate aligner 1240 may be at the side part of the second chamber 1210 and overlap at least any one of the plurality of second load ports LP2 in the vertical direction (e.g., the Z direction). For example, the second substrate aligner 1240 may overlap the second outer load port 1220*b* in the vertical direction (e.g., the Z direction).

The second buffer devices 1250*a* and 1250*b* may provide a buffer space configured to temporarily accommodate the second substrate therein. The second buffer devices 1250*a* and 1250*b* may further include an air supply device configured to supply air to a loaded second substrate. The second buffer devices 1250*a* and 1250*b* may be connected to the side part of the second chamber 1210. For example, the second buffer devices 1250*a* and 1250*b* may overlap at least any one of the plurality of second load ports LP2 in the vertical direction (e.g., the Z direction).

In example embodiments, a plurality of second buffer devices 1250*a* and 1250*b* may be provided. For example, a second inner buffer device 1250*a* may overlap the second inner load port 1220*a* in the vertical direction (e.g., the Z direction) and be connected to the inner side surface of the second chamber 1210. The second outer buffer device 1250*b* may overlap the second outer load port 1220*b* in the vertical direction (e.g., the Z direction) and be connected to the outer side surface of the second chamber 1210.

The second substrate transport robot 1260 may move inside the second chamber 1210 and transport the second substrate. The second substrate transport robot 1260 may be configured to move in the vertical direction (e.g., the Z direction) along a vertical rail in the second chamber 1210. For example, the second substrate transport robot 1260 may include a robot arm and an end effector mounted on an end portion of the robot arm to hold the second substrate. The second substrate transport robot 1260 may transport the second substrate among the second carrier C2, the second loadlock apparatus 1230, the second substrate aligner 1240, and the second buffer devices 1250*a* and 1250*b*. The second substrate transport robot 1260 may be configured to unload the second substrate from the second carrier C2 and supply the second substrate to the second loadlock apparatus 1230, or unload the second substrate from the second loadlock apparatus 1230 and supply the second substrate to the second carrier C2. In addition, the second substrate transport robot 1260 may unload the second substrate from the second loadlock apparatus 1230 and supply the second substrate to the second buffer devices 1250*a* and 1250*b*, and unload the second substrate from the second buffer devices 1250*a* and 1250*b* and supply the second substrate to the second carrier C2.

The second air supply device 1270 may form a descending air current inside the second chamber 1210. The second air supply device 1270 may be configured to purify an internal space of the second chamber 1210. In example embodiments, the second air supply device 1270 may include an FFU. In addition, the second air supply device 1270 may be configured to control humidity of the inside of the second chamber 1210.

Because the first EFEM 1100 may include the plurality of first load ports LP1, and the second EFEM 1200 may include the plurality of second load ports LP2, the substrate processing efficiency of the substrate processing apparatus 1000 including the first EFEM 1100 and the second EFEM 1200 may be improved.

In addition, because the first loadlock apparatus 1130 in the first EFEM 1100 may be arranged to overlap at least any one of the plurality of first load ports LP1 in the vertical direction (e.g., the Z direction), and the second loadlock apparatus 1230 in the second EFEM 1200 may be arranged to overlap at least any one of the plurality of second load ports LP2 in the vertical direction (e.g., the Z direction), the respective footprints (i.e., sizes) of the first EFEM 1100 and the second EFEM 1200 may be reduced.

In addition, because the first substrate aligner 1140 and the plurality of first buffer devices 1150*a* and 1150*b* in the first EFEM 1100 may be arranged to overlap at least any one of the plurality of first load ports LP1 in the vertical direction (e.g., the Z direction), and the second substrate aligner 1240 and the second buffer devices 1250*a* and 1250*b* in the second EFEM 1200 may be arranged to overlap at least any one of the plurality of second load ports LP2 in the vertical direction (e.g., the Z direction), the respective footprints of the first EFEM 1100 and the second EFEM 1200 may be reduced.

The substrate transport chamber 1400 may provide an internal space in which a substrate is transported between the first EFEM 1100 and the substrate processing chamber 1600 and between the second EFEM 1200 and the substrate processing chamber 1600. Pressure of the internal space of the substrate transport chamber 1400 may be similar to pressure of an internal space of each of a plurality of substrate processing chambers 1600. The internal space of the substrate transport chamber 1400 may be maintained as the vacuum pressure. In example embodiments, the substrate transport chamber 1400 may extend in the horizontal direction (e.g., the Y direction) in a plan view, one end portion of the substrate transport chamber 1400 may be connected to the first loadlock apparatus 1130 of the first EFEM 1100 and the second loadlock apparatus 1230 of the second EFEM 1200, and both side surfaces of the substrate transport chamber 1400 may be connected to the plurality of substrate processing chambers 1600.

A substrate transport robot 1500 configured to transport a substrate may be provided inside the substrate transport chamber 1400. The substrate transport robot 1500 may be configured to move in the horizontal direction (e.g., the Y direction) along a transport rail inside the substrate transport chamber 1400, and unload a substrate from the first loadlock apparatus 1130 of the first EFEM 1100 or the second loadlock apparatus 1230 of the second EFEM 1200 and load the substrate in the substrate processing chamber 1600, or unload a substrate treated in the substrate processing chamber 1600 and load the substrate in the first loadlock apparatus 1130 of the first EFEM 1100 or the second loadlock apparatus 1230 of the second EFEM 1200. In example embodiments, the substrate transport robot 1500 may be a vacuum transfer robot configured to handle a substrate at vacuum atmosphere.

The substrate processing chamber 1600 may provide a space in which a substrate received from the first EFEM 1100 and the second EFEM 1200 is treated. In example embodiments, the plurality of substrate processing chambers 1600 may be provided. For example, the substrate processing chamber 1600 may be configured to perform a semiconductor process including etching, cleaning, deposition, and the like on a substrate.

In example embodiments, when the substrate processing apparatus 1000 is viewed in a plan view, some of the plurality of substrate processing chambers 1600 may be arranged to overlap the first EFEM 1100 in the Y direction, and the other some of the plurality of substrate processing chambers 1600 may be arranged to overlap the second EFEM 1200 in the Y direction.

A plurality of first processing boxes 1690 may be above the substrate processing chamber 1600. Some of the plurality of first processing boxes 1690 may accommodate components for plasma processing, and some of the first processing boxes 1690 may store gases for plasma processing. A plurality of second processing boxes 1670 may be below the substrate processing chamber 1600. The plurality of second processing boxes 1670 may accommodate components for substrate process inside the substrate processing chamber 1600. For example, the plurality of second processing boxes 1670 may accommodate plasma equipment.

The inter-EFEM connection device 1700 is between the first EFEM 1100 and the second EFEM 1200 to spatially connect the first EFEM 1100 to the second EFEM 1200. The inter-EFEM connection device 1700 may include a transport tunnel 1710 and a movable stage 1730. The transport tunnel 1710 may connect the first chamber 1110 to the second chamber 1210. In addition, the movable stage 1730 may be configured to transport a substrate by moving in the horizontal direction (e.g., the X direction) inside the transport tunnel 1710. For example, the movable stage 1730 may transport a substrate from the first chamber 1110 to the second chamber 1210 or from the second chamber 1210 to the first chamber 1110. When a defect occurs in any one of the first EFEM 1100 and the second EFEM 1200, a substrate may be transported to a normally operating EFEM to perform a substrate process. For example, when a defect occurs in the first loadlock apparatus 1130 in the first EFEM 1100, the first substrate loaded in the first chamber 1110 may be transported to the second chamber 1210 via the inter-EFEM connection device 1700 and loaded in the second loadlock apparatus 1230 in the second EFEM 1200.

FIGS. 9A to 9E respectively illustrate operations of a substrate processing method according to example embodiments of the inventive concept. Hereinafter, an example substrate processing method using the substrate processing apparatus 1000 is described with reference to FIGS. 9A to 9E.

Figure 9A:
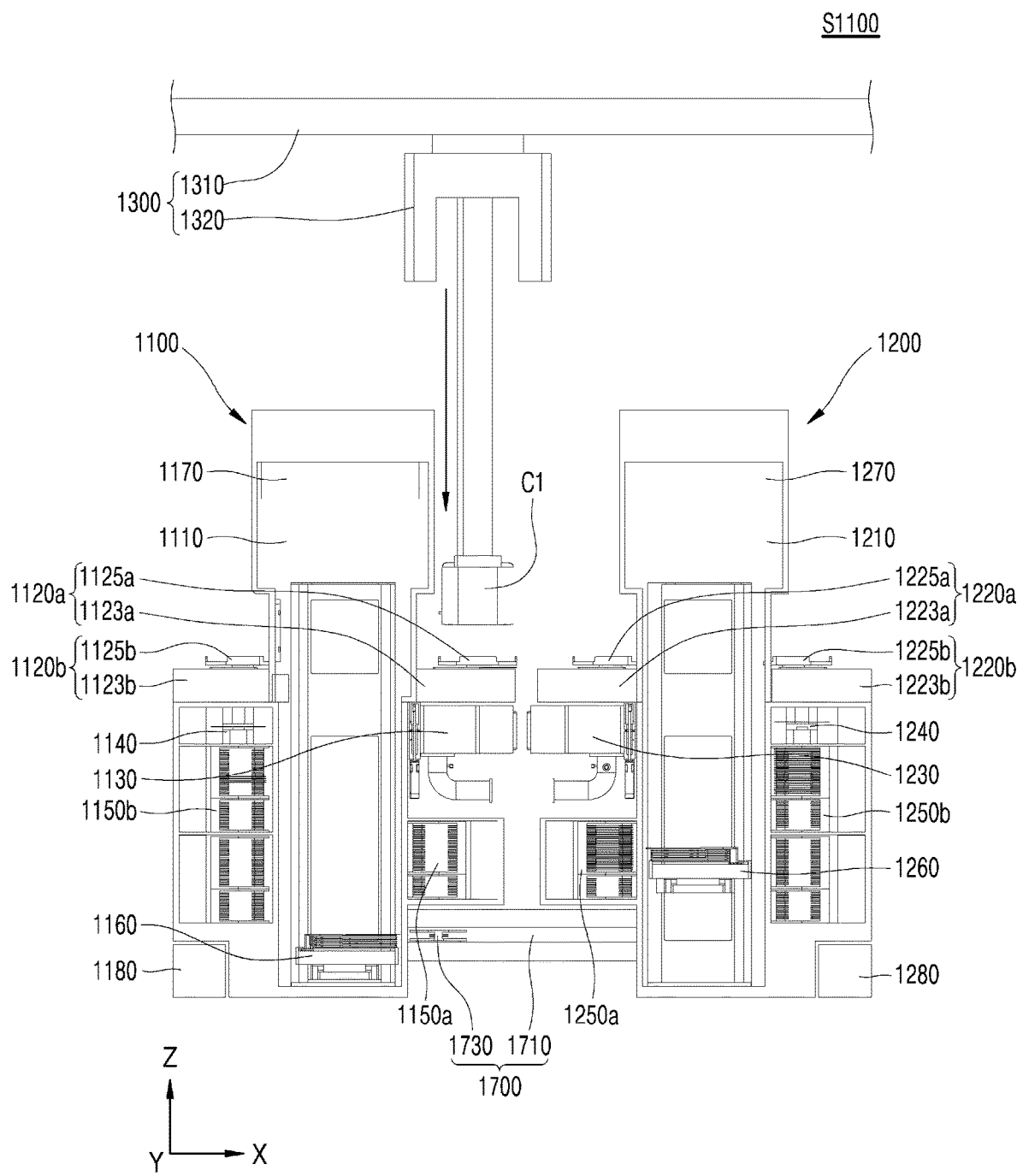
FIGS. 9A to 9E respectively illustrate operations of a substrate processing method according to example embodiments of the inventive concept.

Referring to FIG. 9A, the substrate processing method may include operation S1100 of loading the first carrier C1 on at least any one of the plurality of first load ports LP1 at the side part of the first chamber 1110. In operation S1100, the carrier transport robot 1320 in the carrier transport device 1300 may move in the horizontal direction and the vertical direction (e.g., the Z direction) to load the first carrier C1 on at least any one of the first inner load port 1120*a* and the first outer load port 1120*b*. For example, the carrier transport robot 1320 may provide the first carrier C1 to the first inner load port 1120*a*.

Figure 9B:
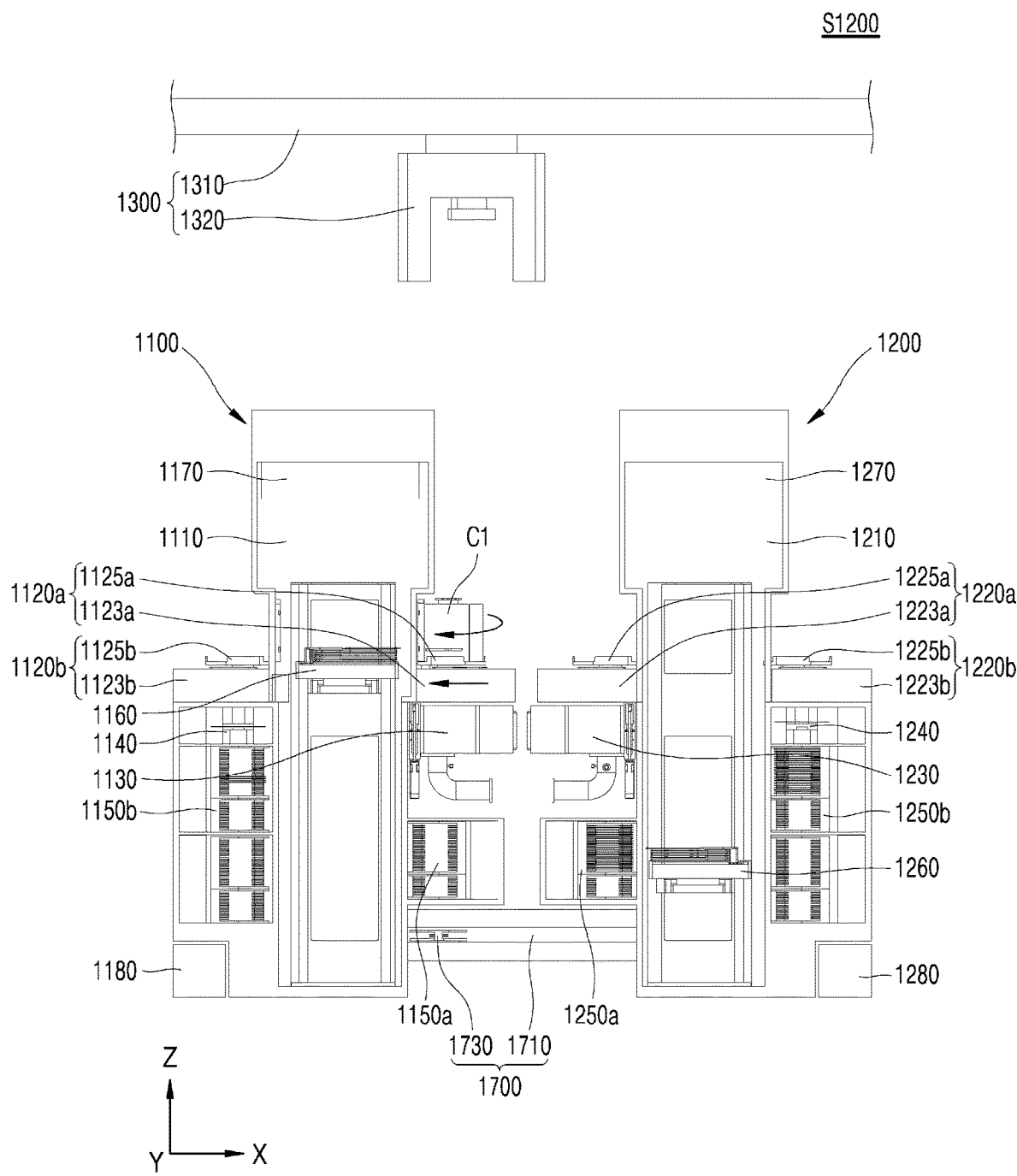

Referring to FIG. 9B, the substrate processing method may include operation S1200 of operating the plurality of first load ports LP1 to couple the first carrier C1 to the first chamber 1110. In operation S1200, to couple the first carrier C1 to the first chamber 1110, the first inner transport tray 1125a supporting the first carrier C1 may move in the horizontal direction through the first inner transport rail 1123a and rotate around a rotary axis extending in the vertical direction (e.g., the Z direction). Once the first carrier C1 is coupled to the first chamber 1110, a door of the first carrier C1 may be opened. The door of the first carrier C1 may be opened by a door operation means at the inside of the first chamber 1110 or to the plurality of first load ports LP1. When the door of the first carrier C1 is opened, an internal space of the first carrier C1 may be connected to the internal space of the first chamber 1110.

Figure 9C:
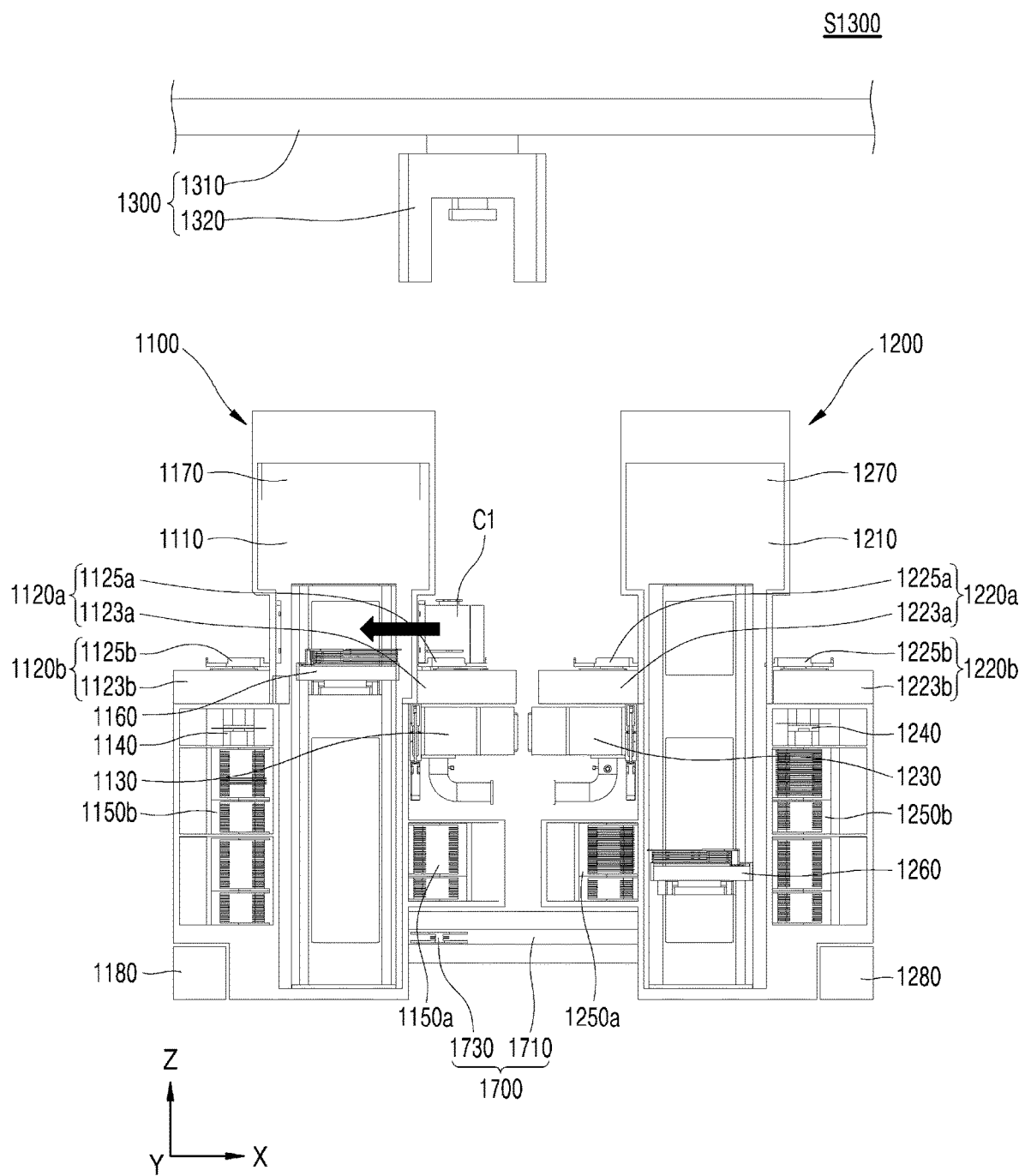

Referring to FIG. 9C, the substrate processing method may include operation S1300 of unloading the first substrate from the first carrier C1 by the first substrate transport robot 1160 configured to move in the vertical direction (e.g., the Z direction) inside the first chamber 1110. In operation S1300, the first substrate transport robot 1160 may move in the vertical direction (e.g., the Z direction) so that the first substrate transport robot 1160 is at the same level as the first carrier C1. In addition, the first substrate transport robot 1160 may move in the horizontal direction to unload the first substrate from the first carrier C1.

Figure 9D:
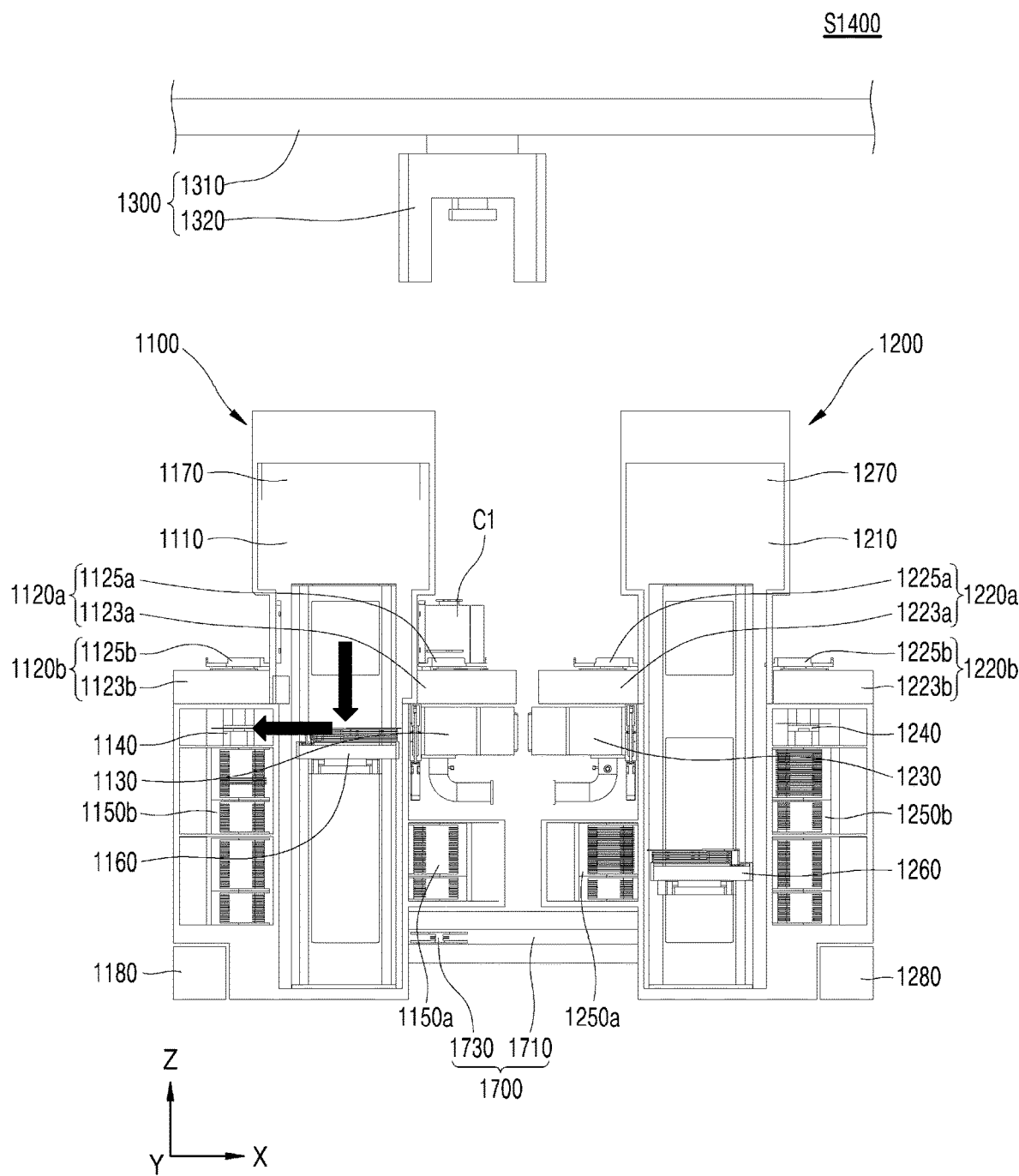

Referring to FIG. 9D, the substrate processing method may include operation S1400 of aligning the first substrate by loading the first substrate on the first substrate aligner 1140 by the first substrate transport robot 1160. In operation S1400, the first substrate aligner 1140 may rotate the first substrate so that the first substrate faces a preset direction. For example, the first substrate aligner 1140 may sense a notch formed on the first substrate and rotate the first substrate on the basis of a position of the sensed notch.

Figure 9E:
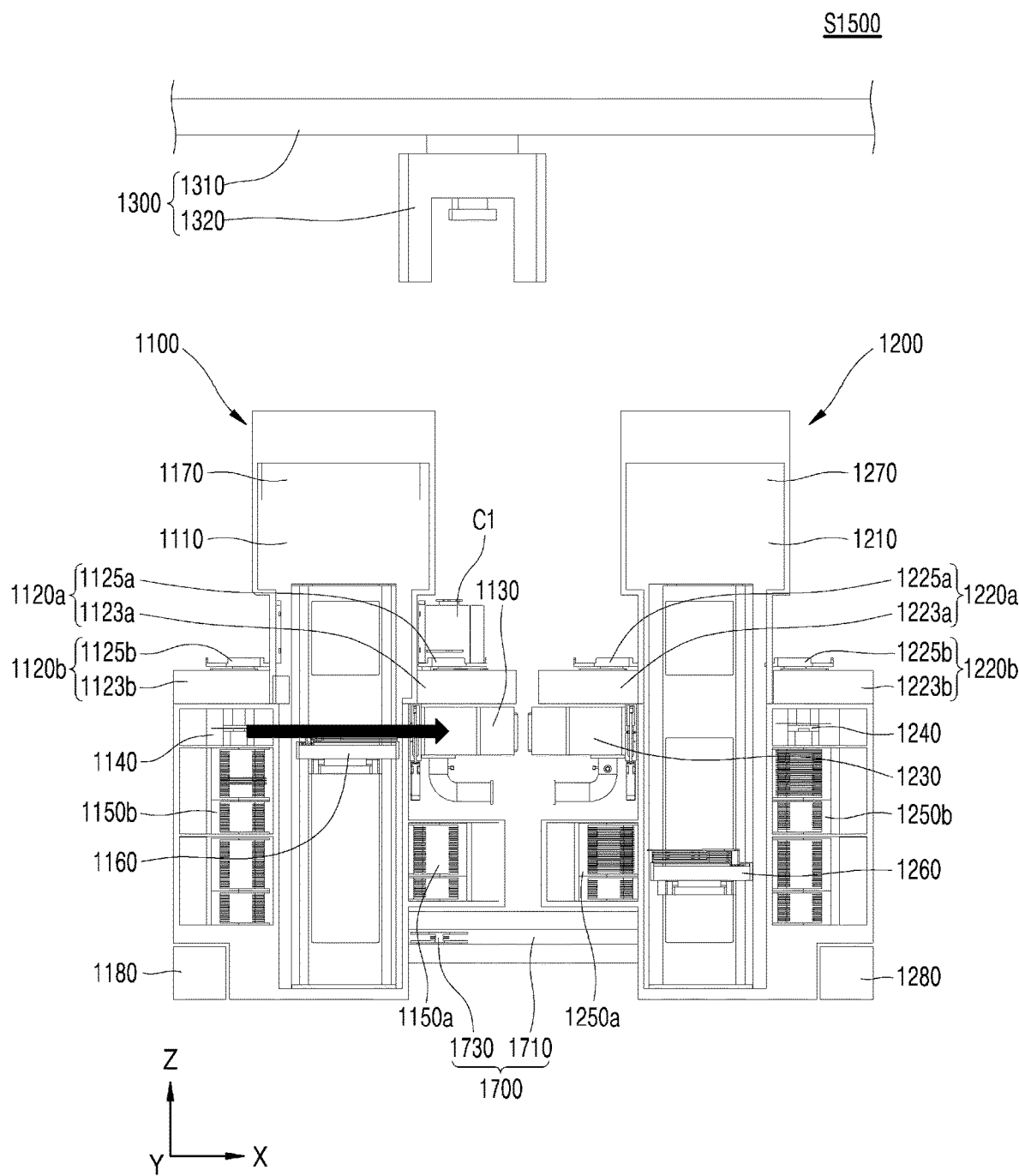

Referring to FIG. 9E, the substrate processing method may include operation S1500 of unloading the first substrate from the first substrate aligner 1140 by the first substrate transport robot 1160 and loading the first substrate in the first loadlock apparatus 1130 at the side part of the first chamber 1110. In operation S1500, to load the first substrate in the first loadlock chamber of the first loadlock apparatus 1130, a plurality of slit valves of the first loadlock apparatus 1130 may be operated to open at least one of openings in one side surface of the first loadlock chamber of the first loadlock apparatus 1130 facing the first chamber 1110. Once the first substrate is loaded in the first loadlock chamber of the first loadlock apparatus 1130, the plurality of slit valves may close the opening of an accommodation space in which the first substrate is loaded. For example, when the first loadlock apparatus 1130 corresponds to the loadlock apparatus 103 shown in FIGS. 4A and 4B, and the first surface 111 of the loadlock chamber 110 faces the first chamber 1110, at least one of the first valve plate 121 and the second valve plate 122 may be placed at an open position to open at least one of the first opening OP1 and the second opening OP2.

Additionally, the substrate processing method may further include: changing, to the vacuum pressure, pressure of the internal space of the first loadlock apparatus 1130 in which the first substrate is loaded; unloading the first substrate from the first loadlock apparatus 1130 and transporting the first substrate to the substrate processing chamber 1600; processing the first substrate in the substrate processing chamber 1600; and unloading the treated first substrate from the substrate processing chamber 1600 and loading the treated first substrate in the first loadlock apparatus 1130.

In the loading of the treated first substrate in the first loadlock apparatus 1130 from the substrate processing chamber 1600, the plurality of slit valves of the first loadlock apparatus 1130 may be operated to open at least one of openings in the other side surface of the first loadlock chamber of the first loadlock apparatus 1130 facing the substrate transport chamber 1400. Once the first substrate is loaded in the first loadlock chamber of the first loadlock apparatus 1130, the plurality of slit valves may close the opening of the accommodation space in which the first substrate is loaded. For example, when the first loadlock apparatus 1130 corresponds to the loadlock apparatus 103 shown in FIGS. 4A and 4B, and the second surface 113 of the loadlock chamber 110 faces the substrate transport chamber 1400, at least one of the fifth valve plate 151 and the sixth valve plate 152 may be placed at an open position to open at least one of the fifth opening OP5 and the sixth opening OP6.

Figure 10A:
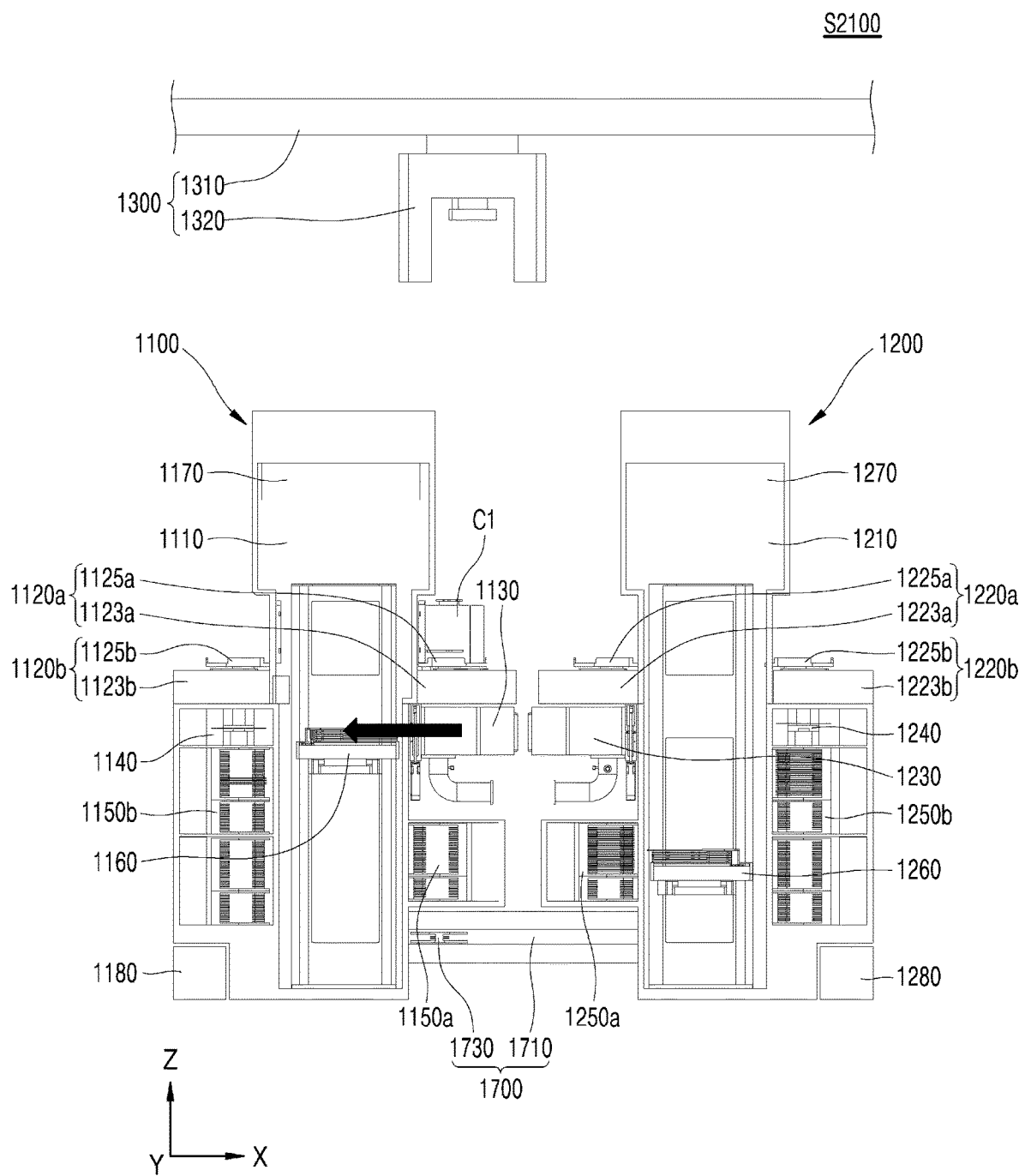
FIGS. 10A to 10C respectively illustrate operations of a substrate processing method according to example embodiments of the inventive concept.
Figure 10B:
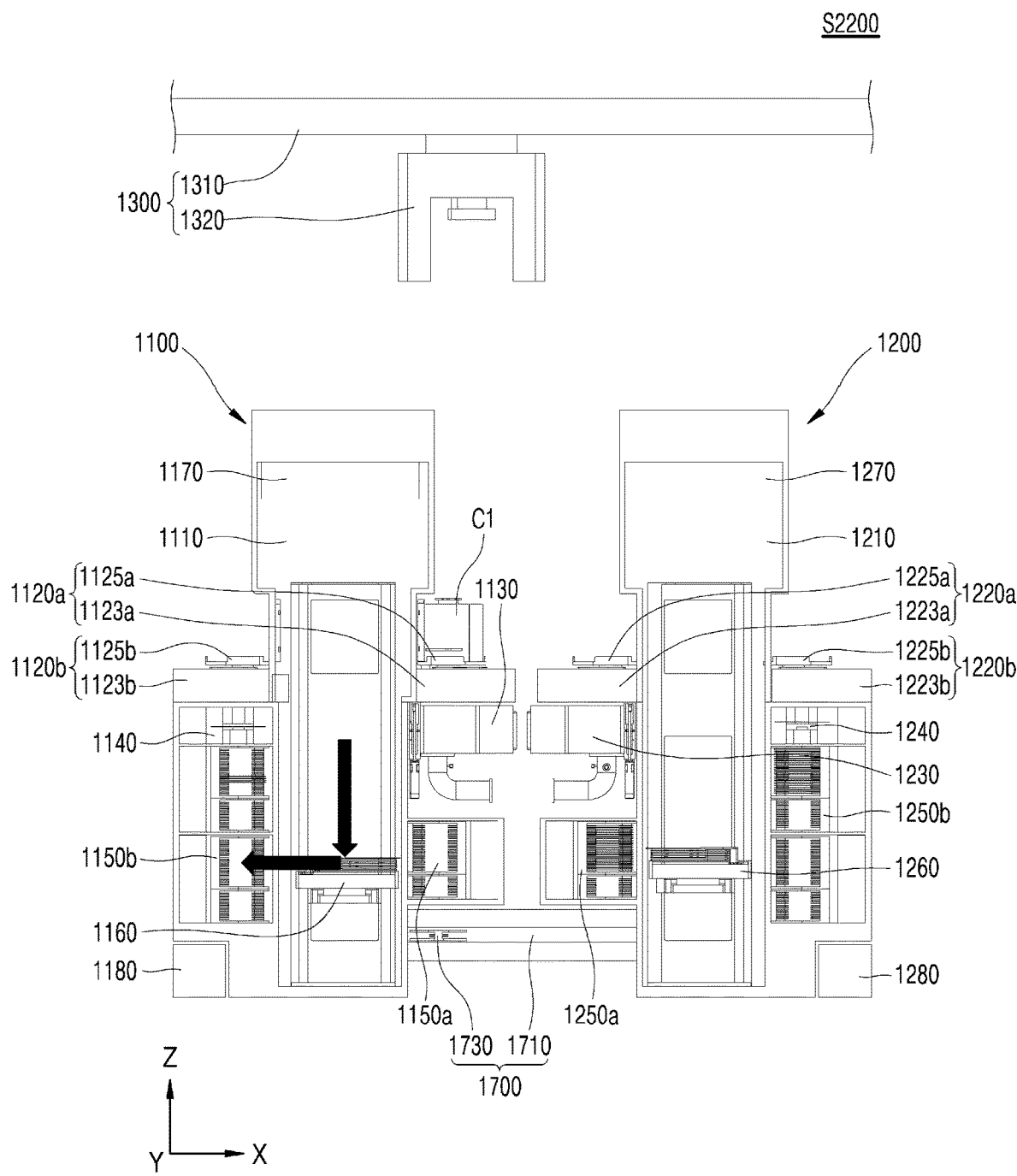
Figure 10C:
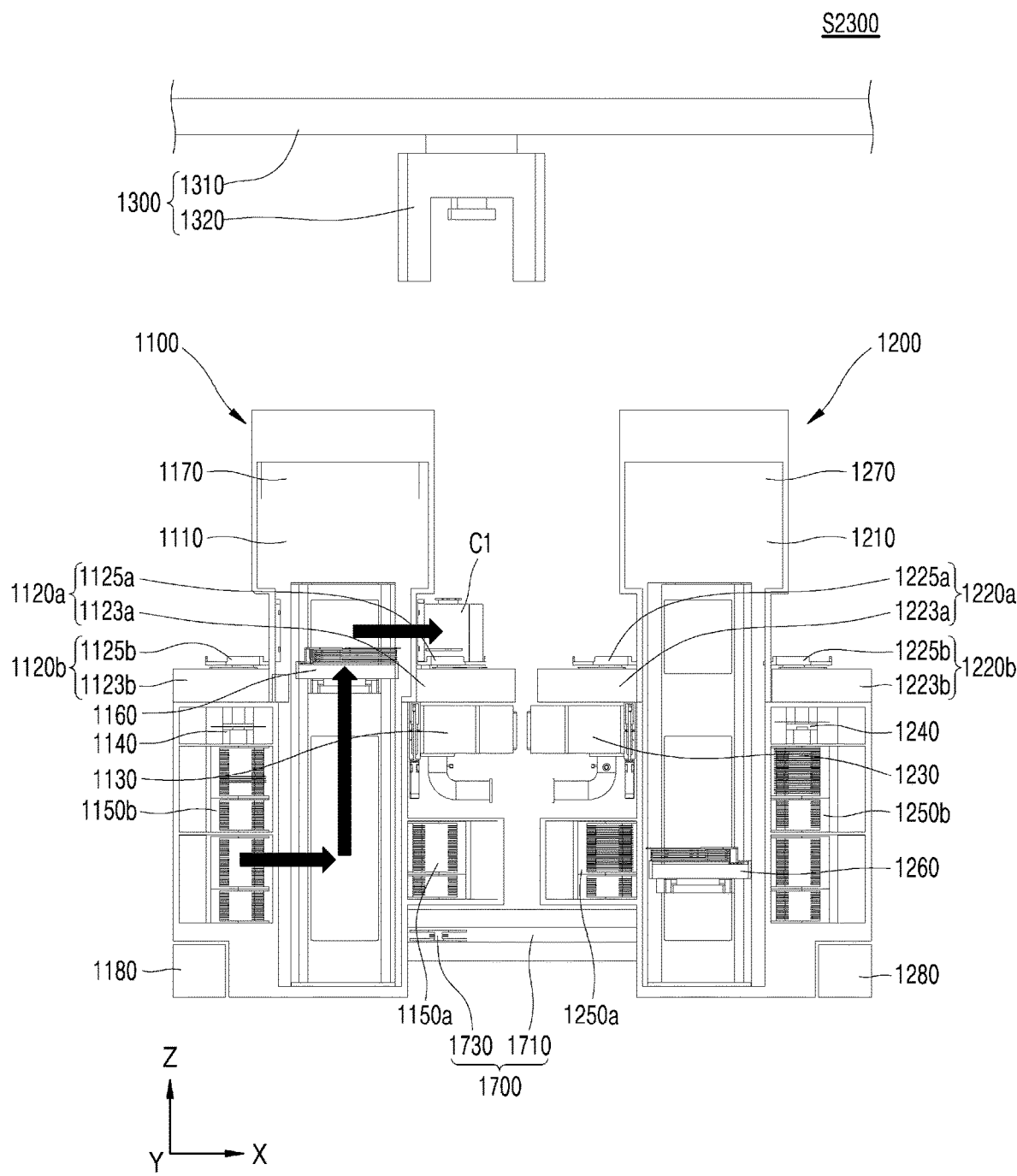

FIGS. 10A to 10C respectively illustrate operations of a substrate processing method according to example embodiments of the inventive concept. Hereinafter, an example substrate processing method using the substrate processing apparatus 1000 is described with reference to FIGS. 10A to 10C.

Referring to FIG. 10A, the substrate processing method may include operation S2100 of unloading the first substrate from the first loadlock apparatus 1130. Operation S2100 may include: changing, to the atmospheric pressure, pressure of an accommodation space in which the first substrate is accommodated; operating the plurality of slit valves of the first loadlock apparatus 1130 to open an opening of the accommodation space in which the first substrate is accommodated; and unloading the first substrate in the first loadlock apparatus 1130 by the first substrate transport robot 1160.

Referring to FIG. 10B, the substrate processing method may include operation S2200 of loading the first substrate in at least any one of the plurality of first buffer devices 1150a and 1150b by the first substrate transport robot 1160. In operation S2200, the first buffer devices 1150a and 1150b may temporarily accommodate a treated first substrate therein. For example, the first outer buffer device 1150b overlapping the first substrate aligner 1140 in the vertical direction (e.g., the Z direction) may temporarily accommodate the treated first substrate therein.

Referring to FIG. 10C, the substrate processing method may include operation S2300 of unloading the first substrate from the first buffer devices 1150a and 1150b and loading the first substrate in the first carrier C1 on the plurality of first load ports LP1.

Once the treated first substrate is loaded in the first carrier C1, the door of the first carrier C1 may be closed. In addition, the carrier transport robot 1320 of the carrier transport device 1300 may move in the vertical direction (e.g., the Z direction) to pick up the first carrier C1 and transport the first carrier C1 to other equipment for a subsequent process.

While the inventive concept has been particularly shown and described with reference to embodiments thereof, it will be understood that various changes in form and details may be made therein without departing from the scope of the following claims.

What is claimed is:
1. A loadlock apparatus comprising:
  a loadlock chamber comprising a first accommodation space, a second accommodation space above the first accommodation space, and a third accommodation space above the second accommodation space, the first accommodation space comprising a first opening, and the second accommodation space comprising a second opening, and the third accommodation space comprising a third opening;

a first slit valve comprising a first valve plate configured to open and close the first opening, and a first actuator configured to move the first valve plate between a first open position where the first opening is open and a first closed position where the first opening is closed, wherein the first valve plate is configured to move to the first open position in a first vertical direction;

a second slit valve comprising a second valve plate configured to open and close the second opening, and a second actuator configured to move the second valve plate between a second open position where the second opening is open and a second closed position where the second opening is closed, wherein the second valve plate is configured to move to the second open position in a second vertical direction opposite to the first vertical direction;

a third slit valve comprising a third valve plate configured to open and close the third opening; and a third actuator configured to move the third valve plate between a third open position where the third opening is open and a third closed position where the third opening is closed, wherein the third valve plate is configured to move to the third open position in the first vertical direction, wherein the first valve plate and the second valve plate vertically overlap, and wherein each of the first valve plate and the second valve plate has a vertical height and a horizontal width, wherein the vertical height is less than the horizontal width.

2. The loadlock apparatus of claim 1, wherein the first actuator and the second actuator are located vertically below the first valve plate, wherein the first slit valve further comprises a first elevation rod connecting the first valve plate and the first actuator, wherein the second slit valve further comprises a second elevation rod connecting the second valve plate and the second actuator, and wherein the second elevation rod comprises a first portion connected to a first side part of the second valve plate and a second portion connected to an opposite second side part of the second valve plate.

3. The loadlock apparatus of claim 2, wherein the first elevation rod is coupled to a central part of the first valve plate.

4. The loadlock apparatus of claim 1, wherein the second valve plate and the third valve plate vertically overlap.

5. The loadlock apparatus of claim 1, wherein the second valve plate and the third valve plate do not vertically overlap.

6. The loadlock apparatus of claim 5, wherein the second valve plate and the third valve plate are in adjacent, spaced apart relationship when in the respective second and third open positions.

7. The loadlock apparatus of claim 1, wherein the loadlock chamber further comprises a fourth accommodation space above the third accommodation space, the fourth accommodation space comprising a fourth opening, the loadlock apparatus further comprising:

a fourth slit valve comprising a fourth valve plate configured to open and close the fourth opening; and a fourth actuator configured to move the fourth valve plate between a fourth open position where the fourth opening is open and a fourth closed position where the fourth opening is closed, wherein the fourth valve plate is configured to move to the fourth open position in the second vertical direction.

8. The loadlock apparatus of claim 7, wherein the third valve plate and the fourth valve plate vertically overlap.

9. The loadlock apparatus of claim 7, wherein a vertical distance between a center of the first opening and a center of the second opening is a first distance, a vertical distance between the center of the second opening and a center of the third opening is a second distance, a vertical distance between the center of the third opening and a center of the fourth opening is a third distance, wherein the first distance is the same as the third distance, and wherein the second distance is greater than the first distance and the third distance.

10. The loadlock apparatus of claim 7, wherein the first actuator and the second actuator are located vertically below the first valve plate, and wherein the third actuator and the fourth actuator are located vertically above the fourth valve plate.

11. The loadlock apparatus of claim 10, wherein the first slit valve further comprises a first elevation rod connecting the first valve plate and the first actuator, wherein the second slit valve further comprises a second elevation rod connecting the second valve plate and the second actuator, wherein the third slit valve further comprises a third elevation rod connecting the third valve plate and the third actuator, wherein the fourth slit valve further comprises a fourth elevation rod connecting the fourth valve plate and the fourth actuator, wherein the second elevation rod comprises a first portion connected to a first side part of the second valve plate and a second portion connected to an opposite second side part of the second valve plate, and wherein the third elevation rod comprises a first portion connected to a first side part of the third valve plate and a second portion connected to an opposite second side part of the third valve plate.

12. The loadlock apparatus of claim 1, wherein the first accommodation space further comprises a fifth opening, and wherein the second accommodation space further comprises a sixth opening, wherein the first opening and the second opening are in a first surface of the loadlock chamber, and the fifth opening and the sixth opening are in a second surface of the loadlock chamber, the loadlock apparatus further comprising:

a fifth slit valve comprising a fifth valve plate configured to open and close the fifth opening, and a fifth actuator configured to move the fifth valve plate between a fifth open position where the fifth opening is open and a fifth closed position where the fifth opening is closed, wherein the fifth valve plate is configured to move to the fifth open position in the first vertical direction; and a sixth slit valve comprising a sixth valve plate configured to open and close the sixth opening, and a sixth actuator configured to move the sixth valve plate between a sixth open position where the sixth opening is open and a sixth closed position where the sixth opening is closed, wherein the sixth valve plate is configured to move to the sixth open position in the second vertical direction, wherein the fifth valve plate and the sixth valve plate vertically overlap.

13. The loadlock apparatus of claim 12, wherein the loadlock chamber further comprises a third accommodation space above the second accommodation space, and a fourth accommodation space above the third accommodation space, wherein the third accommodation space comprises a third opening and a seventh opening, and wherein the fourth accommodation space comprises a fourth opening and an eighth opening, wherein the third opening and the fourth opening are in the first surface of the loadlock chamber, and the seventh opening and the eighth opening are in the second surface of the loadlock chamber, the loadlock apparatus further comprising:
- a third slit valve comprising a third valve plate configured to open and close the third opening, and a third actuator configured to move the third valve plate between a third open position where the third opening is open and a third closed position where the third opening is closed, wherein the third valve plate is configured to move to the third open position in the first vertical direction;
- a fourth slit valve comprising a fourth valve plate configured to open and close the fourth opening, and a fourth actuator configured to move the fourth valve plate between a fourth open position where the fourth opening is open and a fourth closed position where the fourth opening is closed, wherein the fourth valve plate is configured to move to the fourth open position in the second vertical direction;
- a seventh slit valve comprising a seventh valve plate configured to open and close the seventh opening, and a seventh actuator configured to move the seventh valve plate between a seventh open position where the seventh opening is open and a seventh closed position where the seventh opening is closed, wherein the seventh valve plate is moved to the seventh open position in the first vertical direction; and
- an eighth slit valve comprising an eighth valve plate configured to open and close the eighth opening, and an eighth actuator configured to move the eighth valve plate between an eighth open position where the eighth opening is open and an eighth closed position where the eighth opening is closed, wherein the eighth valve plate is configured to move to the eighth open position in the second vertical direction;
wherein the seventh valve plate and the eighth valve plate vertically overlap.

14. A substrate processing apparatus comprising:
a first chamber;
a plurality of first load ports at a side part of the first chamber;
a first loadlock apparatus at the side part of the first chamber;
a first substrate transport robot configured to move inside the first chamber and transport a first substrate between a first substrate carrier and the first loadlock apparatus;
a substrate transport chamber connected to the first loadlock apparatus;
a processing chamber connected to the substrate transport chamber; and
a second substrate transport robot in the substrate transport chamber and configured to transport the first substrate between the first loadlock apparatus and the processing chamber,
wherein the first loadlock apparatus comprises:
a loadlock chamber comprising a first accommodation space, a second accommodation space above the first accommodation space, a third accommodation space above the second accommodation space, and a fourth accommodation space above the third accommodation space, the first accommodation space comprising a first opening, the second accommodation space comprising a second opening, the third accommodation space comprising a third opening, and the fourth accommodation space comprising a fourth opening;
a first valve plate configured to move between a first open position where the first opening is open and a first closed position where the first opening is closed, wherein the first valve plate is configured to move to the first open position in a first vertical direction; and
a second valve plate configured to move between a second open position where the second opening is open and a second closed position where the second opening is closed, wherein the second valve plate is configured to move to the second open position in a second vertical direction opposite to the first vertical direction;
a third valve plate configured to move between a third open position where the third opening is open and a third closed position where the third opening is closed, wherein the third valve plate is configured to move to the third open position in the first vertical direction; and
a fourth valve plate configured to move between a fourth open position where the fourth opening is open and a fourth closed position where the fourth opening is closed, wherein the fourth valve plate is configured to move to the fourth open position in the second vertical direction,
wherein the first valve plate and the second valve plate vertically overlap, wherein the first opening and the second opening are in a first surface of the loadlock chamber facing the first chamber, wherein the third valve plate and the fourth valve plate vertically overlap, and wherein the third opening and the fourth opening are in the first surface of the loadlock chamber.

15. The substrate processing apparatus of claim 14, wherein the first slit valve comprises a first elevation rod coupled to a central part of the first valve plate and that extends in a first direction, and wherein the fourth slit valve comprises a fourth elevation rod coupled to a central part of the fourth valve plate and that extends in a second direction opposite to the first direction.

16. The substrate processing apparatus of claim 14, wherein the first accommodation space further comprises a fifth opening, wherein the second accommodation space further comprises a sixth opening, wherein the third accommodation space further comprises a seventh opening, and wherein the fourth accommodation space further comprises an eighth opening, and wherein the first loadlock apparatus further comprises:
- a fifth valve plate configured to move between a fifth open position where the fifth opening is open and a fifth closed position where the fifth opening is closed, wherein the fifth valve plate is configured to move to the fifth open position in the first vertical direction,
- a sixth valve plate configured to move between a sixth open position where the sixth opening is open and a sixth closed position where the sixth opening is closed, wherein the sixth valve plate is configured to move to the sixth open position in the second vertical direction,
- a seventh valve plate configured to move between a seventh open position where the seventh opening is open and a seventh closed position where the seventh opening is closed, wherein the seventh valve plate is configured to move to the seventh open position in the first vertical direction; and
- an eighth valve plate configured to move between an eighth open position where the eighth opening is open and an eighth closed position where the eighth opening is closed, wherein the eighth valve plate is configured to move to the eighth open position in the second vertical direction, wherein the fifth opening, sixth opening, seventh opening and eighth opening are each in a second surface of the loadlock chamber facing the substrate transport chamber.

17. The substrate processing apparatus of claim 14, wherein the plurality of first load ports comprise:
a first inner load port at an inner side surface of the first chamber; and
a first outer load port at an outer side surface of the first chamber.

18. The substrate processing apparatus of claim 14, further comprising:
a second chamber;
a plurality of second load ports at a side part of the second chamber;
a second loadlock apparatus at the side part of the second chamber; and
a second substrate transport robot configured to move inside the second chamber and transport a second substrate between a second substrate carrier and the second loadlock apparatus,
wherein the second substrate transport robot is further configured to transport the second substrate between the second loadlock apparatus and the processing chamber.

19. The substrate processing apparatus of claim 18, further comprising:
a transport tunnel connecting the first chamber and the second chamber; and
a movable stage inside the transport tunnel, the movable stage configured to transport at least any one of the first substrate and the second substrate between the first chamber and the second chamber.

20. A substrate processing method comprising:
loading a carrier, which has a substrate loaded therein, on a load port at a side part of a chamber;
transporting the substrate from the carrier to a loadlock apparatus via a first substrate transport robot configured to move vertically inside the chamber;
transporting the substrate from the loadlock apparatus to a processing chamber via a second substrate transport robot in a substrate transport chamber connected to the loadlock apparatus; and
processing the substrate inside the processing chamber,
wherein the loadlock apparatus comprises:
a loadlock chamber comprising a first accommodation space, a second accommodation space above the first accommodation space, and a third accommodation space above the second accommodation space, wherein the first accommodation space comprises a first opening, wherein the second accommodation space comprises a second opening, and wherein the third accommodation space comprises a third opening;
a first slit valve comprising a first valve plate configured to open and close the first opening, and a first actuator configured to move the first valve plate between a first open position where the first opening is open and a first closed position where the first opening is closed, wherein the first valve plate is configured to move to the first open position in a first vertical direction;
a second slit valve comprising a second valve plate configured to open and close the second opening, and a second actuator configured to move the second valve plate between a second open position where the second opening is open and a second closed position where the second opening is closed, wherein the second valve plate is configured to move to the second open position in a second vertical direction opposite to the first vertical direction; and
a third slit valve comprising a third valve plate configured to open and close the third opening, and a third actuator configured to move the third valve plate between a third open position where the third opening is open and a third closed position where the third opening is closed, wherein the third valve plate is configured to move to the third open position in the first vertical direction,
wherein the first opening and the second opening are in one side surface of the loadlock chamber facing the chamber, and wherein the transporting of the substrate from the carrier to the loadlock apparatus comprises moving at least one of the first valve plate and the second valve plate so that at least one of the first opening and the second opening is open.

* * * * *